US010927327B2

(12) United States Patent
Kamimura et al.

(10) Patent No.: US 10,927,327 B2
(45) Date of Patent: Feb. 23, 2021

(54) TREATMENT LIQUID, METHOD FOR WASHING SUBSTRATE, AND METHOD FOR MANUFACTURING SEMICONDUCTOR DEVICE

(71) Applicant: FUJIFILM Corporation, Tokyo (JP)

(72) Inventors: Tetsuya Kamimura, Haibara-gun (JP); Tomonori Takahashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 13 days.

(21) Appl. No.: 16/272,516

(22) Filed: Feb. 11, 2019

(65) Prior Publication Data

US 2019/0177669 A1    Jun. 13, 2019

Related U.S. Application Data

(63) Continuation of application No. PCT/JP2017/030820, filed on Aug. 29, 2017.

(30) Foreign Application Priority Data

Aug. 31, 2016    (JP) .............................. JP2016-169773

(51) Int. Cl.
*C11D 7/32* (2006.01)
*H01L 21/304* (2006.01)
(Continued)

(52) U.S. Cl.
CPC ............ *C11D 7/3281* (2013.01); *C11D 3/044* (2013.01); *C11D 3/2075* (2013.01); *C11D 3/30* (2013.01);
(Continued)

(58) Field of Classification Search
CPC ................................................ C11D 11/0047
(Continued)

(56) References Cited

U.S. PATENT DOCUMENTS

2006/0003910 A1* 1/2006 Hsu ..................... C23F 11/141
510/176
2010/0152085 A1* 6/2010 Shimada .............. C11D 3/3723
510/175
(Continued)

FOREIGN PATENT DOCUMENTS

CN      105190846 A    12/2015
JP      2006-009006 A    1/2006
(Continued)

OTHER PUBLICATIONS

International Search Report dated Nov. 21, 2017 in International Application No. PCT/JP2017/030820.
(Continued)

*Primary Examiner* — Gregory E Webb
(74) *Attorney, Agent, or Firm* — Sughrue Mion, PLLC

(57) ABSTRACT

An object of the present invention is to provide a treatment liquid for a semiconductor device, which has excellent temporal stability of residue removing performance, and excellent anticorrosion performance for a treatment target. In addition, another object of the present invention is to provide a method for washing a substrate and a method for manufacturing a semiconductor device, each using the treatment liquid.

The treatment liquid of an embodiment of the present invention is a treatment liquid for a semiconductor device, including at least one hydroxylamine compound selected from the group consisting of hydroxylamine and a hydroxylamine salt, at least one basic compound selected from the group consisting of an amine compound other than the hydroxylamine compound and a quaternary ammonium hydroxide salt, and at least one selected from the group
(Continued)

consisting of a reducing agent other than the hydroxylamine compound and a chelating agent, and having a pH of 10 or more.

27 Claims, 1 Drawing Sheet

(51) Int. Cl.
*C11D 3/20* (2006.01)
*C11D 3/30* (2006.01)
*C11D 3/04* (2006.01)
*C11D 7/34* (2006.01)
*C11D 7/36* (2006.01)
*C11D 7/06* (2006.01)
*C11D 7/10* (2006.01)
*C11D 7/26* (2006.01)
*C11D 7/50* (2006.01)
*C11D 11/00* (2006.01)

(52) U.S. Cl.
CPC .................. *C11D 7/06* (2013.01); *C11D 7/10* (2013.01); *C11D 7/265* (2013.01); *C11D 7/3209* (2013.01); *C11D 7/34* (2013.01); *C11D 7/36* (2013.01); *C11D 7/5009* (2013.01); *C11D 7/5022* (2013.01); *C11D 11/0047* (2013.01); *H01L 21/304* (2013.01)

(58) Field of Classification Search
USPC .......................................................... 510/175
See application file for complete search history.

(56) References Cited

U.S. PATENT DOCUMENTS

| | | |
|---|---|---|
| 2012/0157368 A1 | 6/2012 | Mizuta et al. |
| 2015/0159124 A1* | 6/2015 | Takahashi ............ C11D 3/0073 510/175 |
| 2016/0060584 A1 | 3/2016 | Mizuta et al. |
| 2016/0122695 A1 | 5/2016 | Kumagai et al. |
| 2016/0272924 A1* | 9/2016 | Kajikawa ............ C11D 7/3209 |

FOREIGN PATENT DOCUMENTS

| | | |
|---|---|---|
| JP | 2016-090753 A | 5/2016 |
| KR | 10-0700998 B1 | 3/2007 |
| KR | 10-2016-0083885 A | 7/2016 |
| TW | 201527520 A | 7/2015 |
| WO | 2011027772 A1 | 3/2011 |
| WO | 2015/068823 A1 | 5/2015 |

OTHER PUBLICATIONS

Written Opinion dated Nov. 21, 2017 in International Application No. PCT/JP2017/030820.
English translation of International Preliminary Report on Patentability dated Mar. 5, 2019 in International Application No. PCT/JP2017/030820.
Communication dated Feb. 20, 2020 from Korean Intellectual Property Office in KR Application No. 10-2019-7003822.
Notice of Reason for Refusal dated Jan. 7, 2020 from the Japanese Patent Office in application No. 2018-537280.
Office Action dated Nov. 16, 2020 from the Intellectual Property Office of Taiwan in TW Application No. 106129422.

* cited by examiner

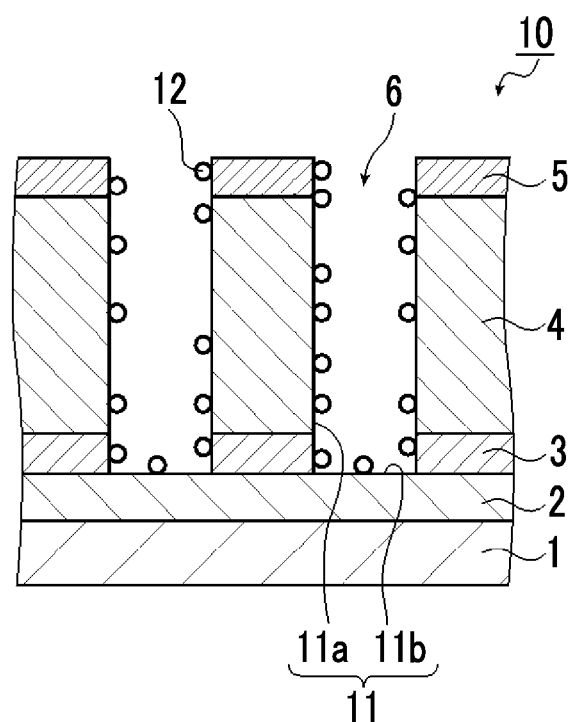

TREATMENT LIQUID, METHOD FOR WASHING SUBSTRATE, AND METHOD FOR MANUFACTURING SEMICONDUCTOR DEVICE

CROSS-REFERENCE TO RELATED APPLICATIONS

This application is a Continuation of PCT International Application No. PCT/JP2017/030820 filed on Aug. 29, 2017, which claims priority under 35 U.S.C. § 119(a) to Japanese Patent Application No. 2016-169773 filed on Aug. 31, 2016. The above application is hereby expressly incorporated by reference, in its entirety, into the present application.

BACKGROUND OF THE INVENTION

1. Field of the Invention

The present invention relates to a treatment liquid and a method for washing a substrate. In particular, the present invention relates to a treatment liquid which can be suitably used for the manufacture of a semiconductor device, and a method for washing a substrate using the treatment liquid.

In addition, the present invention also relates to a method for manufacturing a semiconductor device using the treatment liquid.

2. Description of the Related Art

A semiconductor device such as a charge-coupled device (CCD) and a memory is manufactured by forming a laminate having fine electronic circuit patterns on a substrate using a photolithographic technique. Specifically, the semiconductor device is manufactured by forming a resist film on a laminate having a metal film that serves as a wiring material, an etching stop layer, and an interlayer insulating layer on a substrate, and carrying out a photolithography step and a dry etching step (for example, a plasma etching treatment).

Moreover, in order to realize further miniaturization of semiconductor devices in recent years, a metal material-based resist film such as TiN and $AlO_x$ (a so-called metal hard mask) has also been used as the resist film. In a case where a metal hard mask is used as the resist film, a dry etching step (for example, a plasma etching treatment) is usually performed using the metal hard mask as a mask, and a step of forming holes based on the pattern shape of the metal hard mask and exposing the surface of the metal film that serves as a wiring film.

A substrate which has been subjected to a dry etching step includes a large amount of dry etching residues (metal components such as a titanium-based metal, for example, as a residue component in a case where a metal hard mask is used as a resist film are included, and on the other hand, in a case where a photoresist film is used, a large amount of organic components are included as a residue component) deposited thereon. It is general that these residues are removed using a treatment liquid so as not to interfere with the next step.

For example, JP2016-090753A discloses "a washing liquid for lithography, containing at least one basic compound selected from the group consisting of a hydroxylamine, an amine compound other than the hydroxylamine, and a quaternary ammonium hydroxide, and having a pH of 8 or more".

SUMMARY OF THE INVENTION

The present inventors have conducted studies on the washing liquid (treatment liquid) described in JP2016-090753A, and as a result, they have found that as the pH of the treatment liquid is higher (with the pH being 10 or more), the reducing power of the hydroxylamine compound is enhanced, the residue removing performance is thus excellent, but the performance is likely to be noticeably degraded after storage over time. That is, the present inventors have found that it is necessary to improve the temporal stability of the residue removing performance of the treatment liquid.

Based on these findings, the present inventors have conducted further studies on the temporal stability of the hydroxylamine compound included in the treatment liquid, and as a result, they have found that the hydroxylamine compound is likely to be oxidized and decomposed by the components having an oxidative action (for example, $OH^-$ ions, dissolved oxygen, $Fe^{2+}$, and $Fe^{3+}$) included in the treatment liquid in a high-pH environment (with the pH being 10 or more). The decomposition reaction of the hydroxylamine compound is an irreversible reaction, and that is, in a case where the hydroxylamine compound is oxidized by the components having an oxidative action, it is decomposed into the nitrogen atom and water, and thus, loses its residue removing performance. As a result, it was considered that performance degradation after the storage over time as described above occurs. In addition, it was found that in a case of application of heat to the treatment liquid, the above-mentioned decomposition reaction further proceeds.

Moreover, on the other hand, the treatment liquid is required to suppress a wiring metal which is a treatment target (a metal, a metal nitride, and an alloy, such as Co or a Co alloy which is used as a wiring metal) from being corroded (anticorrosion performance).

Therefore, an object of the present invention is to provide a treatment liquid for a semiconductor device, which has excellent temporal stability of residue removing performance, and excellent anticorrosion performance for a treatment target.

In addition, another object of the present invention is to provide a method for washing a substrate and a method for manufacturing a semiconductor device, each using the treatment liquid.

The present inventors have conducted extensive studies in order to accomplish the objects, and as a result, they have found that the objects are accomplished by incorporating at least one selected from the group consisting of a reducing agent other than the hydroxylamine compound and a chelating agent into the treatment liquid, thereby completing the present invention.

That is, The present inventors have found that the objects can be accomplished by the following configurations.

(1) A treatment liquid for a semiconductor device, comprising:
at least one hydroxylamine compound selected from the group consisting of a hydroxylamine and a hydroxylamine salt;
at least one basic compound selected from the group consisting of an amine compound other than the hydroxylamine compound and a quaternary ammonium hydroxide salt; and
at least one selected from the group consisting of a reducing agent other than the hydroxylamine compound and a chelating agent, and
having a pH of 10 or more.

(2) The treatment liquid as described in (1),
which is used as a washing liquid for removing dry etching residues, a solution for removing a resist film used for the formation of a pattern, or a washing liquid for removing residues from a substrate after chemical mechanical polishing.

(3) The treatment liquid as described in (1) or (2),
which is used for a treatment to a metal layer of a substrate comprising the metal layer including Co or a Co alloy.

(4) The treatment liquid as described in any one of (1) to (3), further comprising an organic solvent.

(5) The treatment liquid as described in (4),
in which the content of the organic solvent is 45% by mass or more with respect to the total mass of the treatment liquid.

(6) The treatment liquid as described in (4) or (5), further comprising water,
in which with respect to the total mass of the treatment liquid, the content of water is 1% to 50% by mass, and
the content of the organic solvent is 45% to 98% by mass.

(7) The treatment liquid as described in any one of (1) to (6),
in which the content of the hydroxylamine compound is 3.5% by mass or more with respect to the total mass of the treatment liquid.

(8) The treatment liquid as described in any one of (1) to (7),
in which the chelating agent has at least one functional group selected from a carboxylic acid group, a sulfonic acid group, or a phosphonic acid group.

(9) The treatment liquid as described in any one of (1) to (8),
in which the basic compound is a cyclic compound.

(10) The treatment liquid as described in (9),
in which the basic compound is at least one selected from the group consisting of tetrahydrofurfurylamine, N-(2-aminoethyl)piperazine, 1,8-diazabicyclo[5.4.0]-7-undecene, and 1,4-diazabicyclo[2.2.2]octane.

(11) The treatment liquid as described in any one of (1) to (10),
in which the reducing agent is one selected from the group consisting of a compound represented by Formula (B) which will be described later, ascorbic acids, and a compound containing a sulfur atom.

(12) The treatment liquid as described in any one of (1) to (11), further comprising a corrosion inhibitor.

(13) The treatment liquid as described in (12),
which contains a compound represented by Formula (A) which will be described later as the corrosion inhibitor.

(14) The treatment liquid as described in any one of (1) to (13),
in which the content of the hydroxylamine compound with respect to the content of the reducing agent is 0.1 to 20 in terms of mass ratio.

(15) The treatment liquid as described in any one of (1) to (14),
in which the content of the basic compound with respect to the content of the reducing agent is 0.1 to 20 in terms of mass ratio.

(16) The treatment liquid as described in any one of (1) to (15),
which is used after being diluted 5 to 2,000 folds.

(17) The treatment liquid as described in (16),
which is diluted with a diluting liquid including water.

(18) A method for washing a substrate, comprising a washing step of washing a substrate comprising a metal layer including Co or a Co alloy using the treatment liquid as described in any one of (1) to (15).

(19) The method for washing a substrate as described in (18),
in which the washing step is carried out using a diluted liquid after obtaining the diluted liquid by diluting the treatment liquid 5 to 2,000 folds.

(20) The method for washing a substrate as described in (19),
in which the dilution is performed using a diluting liquid including water.

(21) A method for manufacturing a semiconductor device, comprising a step of washing a substrate including a metal hard mask including at least one of Cu, Co, W, $AlO_x$, AlN, $AlO_xN_y$, $WO_x$, Ti, TiN, $ZrO_x$, $HfO_x$, or $TaO_x$ with the treatment liquid as described in any one of (1) to (15), in which x and y are numbers represented by x=1 to 3 and y=1 to 2, respectively.

According to the present invention, it is possible to accomplish an object of providing a treatment liquid for a semiconductor device, which has excellent temporal stability of residue removing performance and excellent anticorrosion performance for a treatment target.

Furthermore, according to the present invention, it is possible to provide a method for washing a substrate and a method for manufacturing a semiconductor device, each using the treatment liquid.

BRIEF DESCRIPTION OF THE DRAWING

FIG. 1 is a schematic cross-sectional view showing an example of a laminate which can be applied to the method for washing a substrate of an embodiment of the present invention.

DESCRIPTION OF THE PREFERRED EMBODIMENTS

Hereinbelow, the present invention will be described in detail.

Description of configuration requirements described below may be made on the basis of representative embodiments of the present invention, but the present invention is not limited to such embodiments.

Furthermore, in the present specification, the numerical value ranges shown using "to" mean ranges including the numerical values indicated before and after "to" as the lower limit value and the upper limit value, respectively.

Moreover, in the present invention, a reference to "preparation" is meant to encompass delivering a predetermined material by purchases or the like, in addition to comprising specific materials by synthesis, combination, or the like.

Incidentally, in the present invention, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

Furthermore, in the present invention, 1 Å (angstrom) corresponds to 0.1 nm.

In addition, in citations for a group (atomic group) in the present invention, in a case where the group (atomic group) is denoted without specifying whether it is substituted or unsubstituted, the group (atomic group) includes both a group (atomic group) having no substituent and a group (atomic group) having a substituent within a range not impairing the effects of the present invention. For example, a "hydrocarbon group" includes not only a hydrocarbon group having no substituent (unsubstituted hydrocarbon group) but also a hydrocarbon group having a substituent (substituted hydrocarbon group). This also applies to the respective compounds.

In addition, "radiation" in the present invention means, for example, a bright line spectrum of a mercury lamp, far ultraviolet rays typified by excimer laser, extreme ultraviolet rays (EUV light), X-rays, or electron beams. Further, the term "light" in the present invention means actinic rays or radiation. Unless otherwise indicated, the term "exposure" in the present invention includes not only exposure to a bright line spectrum of a mercury lamp, far ultraviolet rays typified by excimer laser, X-rays, EUV light, or the like but also exposure using writing with particle beams such as electron beams and ion beams.

[Treatment Liquid]

The treatment liquid of an embodiment of the present invention is a treatment liquid for a semiconductor device, containing:

at least one hydroxylamine compound selected from the group consisting of a hydroxylamine and a hydroxylamine salt, at least one basic compound selected from the group consisting of an amine compound other than the hydroxylamine compound and a quaternary ammonium hydroxide salt; and at least one selected from the group consisting of a reducing agent other than the hydroxylamine compound and a chelating agent, and having a pH of 10 or more.

The treatment liquid of an embodiment of the present invention has excellent temporal stability of residue removing performance and excellent anticorrosion performance for a treatment target by adopting the above configurations.

The reason therefor is not specifically clear, but is presumed to be as follows.

It is thought that the reducing agent other than the hydroxylamine compound and the chelating agent in the treatment liquid trap the components having an oxidative action (for example, $OH^-$ ions, dissolved oxygen, $Fe^{2+}$, and $Fe^{3+}$) included in the treatment liquid to reduce a probability of occurrence of redox reactions of the components having an oxidative action and the hydroxylamine compound. As a result, it is assumed that the decomposition of the hydroxylamine compound is suppressed, and thus, the residue removing performance of the treatment liquid is maintained for a long period of time. Further, it is found that in the treatment liquid of the embodiment of the present invention, the decomposition of the hydroxylamine compound hardly occurs even in a thermal environment (in other words, the temporal stability in a thermal environment is also excellent). Incidentally, it is also found that the treatment liquid of the embodiment of the present invention is also excellent in anticorrosion performance for a treatment target (in particular, a metal layer including Co or a Co alloy).

Hereinafter, the respective components included in the treatment liquid of the embodiment of the present invention will be described.

<Hydroxylamine Compound>

The treatment liquid of the embodiment of the present invention has at least one hydroxylamine compound selected from the group consisting of a hydroxylamine and a hydroxylamine salt. The hydroxylamine compound has a function to accelerate the decomposition and the solubilization of residues.

Here, the "hydroxylamine" with regard to the hydroxylamine compound of the treatment liquid of the embodiment of the present invention refers to a hydroxylamine compound in a wide sense, including a substituted or unsubstituted alkylhydroxylamine, with any of which the effect of the present invention can be obtained.

The hydroxylamine compound is not particularly limited, but preferred aspects thereof include an unsubstituted hydroxylamine and a hydroxylamine derivative, and salts thereof.

The hydroxylamine derivative is not particularly limited, but examples thereof include O-methylhydroxylamine, O-ethylhydroxylamine, N-methylhydroxylamine, N,N-dimethylhydroxylamine, N,O-dimethylhydroxylamine, N-ethylhydroxylamine, N,N-diethylhydroxylamine, N,O-diethylhydroxylamine, O,N,N-trimethylhydroxylamine, N,N-dicarboxyethylhydroxylamine, and N,N-disulfoethylhydroxylamine.

The salt of the unsubstituted hydroxylamine or hydroxylamine derivative is preferably an inorganic acid salt or an organic acid salt of the above-mentioned unsubstituted hydroxylamine or hydroxylamine derivative, more preferably a salt of an inorganic acid formed by the bonding of a non-metal atom such as Cl, S, N, and P with a hydrogen atom, and still more preferably a salt of any one acid of hydrochloric acid, sulfuric acid, or nitric acid. Among those, hydroxylamine nitrate, hydroxylamine sulfate, hydroxylamine hydrochloride, hydroxylamine phosphate, N,N-diethylhydroxylamine sulfate, N,N-diethylhydroxylamine nitrate, or a mixture thereof is preferable.

Furthermore, an organic acid salt of the above-mentioned unsubstituted hydroxylamine or hydroxylamine derivative can also be used, and examples thereof include hydroxylammonium citrate, hydroxylammonium oxalate, and hydroxylammonium fluoride.

Among those, from the viewpoint that the residue removing performance is more excellent, hydroxylamine, hydroxylamine sulfate, or hydroxylamine hydrochloride is preferable, and from the viewpoint that the anticorrosion performance is more excellent, hydroxylamine, hydroxylamine sulfate, or N,N-diethylhydroxylamine amines is preferable.

The content of the hydroxylamine compound is usually 0.01% to 30% by mass with respect to the total mass of the treatment liquid. From the viewpoint that the residue removing performance is more excellent, the lower limit of the content is preferably 3.5% by mass or more, and more preferably 12% by mass or more. Among those, from the viewpoint of achieving both excellent residue removing performance and excellent anticorrosion performance, the content of the hydroxylamine compound is more preferably 12% to 25% by mass with respect to the total mass of the treatment liquid.

Furthermore, the content of the hydroxylamine compound to the content of the reducing agent other than the hydroxylamine compound which will be described later is preferably 0.1 to 20, and more preferably 0.5 to 12, in terms of mass ratio. By setting the content of the hydroxylamine compound to the content of the reducing agent other than the hydroxylamine compound to 20 or less in terms of mass ratio, the temporal stability in a thermal environment is also more excellent. On the other hand, by setting the content of the hydroxylamine compound to the content of the reducing agent other than the hydroxylamine compound to 0.1 or more in terms of mass ratio, the residue removing performance and the temporal stability are more excellent.

<Basic Compound>

As long as the basic compound is at least one selected from the group consisting of an amine compound other than the hydroxylamine compound and a quaternary ammonium hydroxide salt, it is not particularly limited. The basic compound functions as a pH adjuster in the treatment liquid.

Furthermore, as the basic compound, a cyclic compound (compound having a cyclic structure) is preferable. Examples of the cyclic compound include an amine compound having a cyclic structure which will be described later.

In the treatment liquid of the embodiment of the present invention, the content of the basic compound to the content of the reducing agent other than the hydroxylamine compound, which will be described later is preferably 0.1 to 20, and more preferably 0.5 to 12, in terms of mass ratio. By setting the content of the basic compound to the content of the reducing agent other than the hydroxylamine compound to 20 or less in terms of mass ratio, the temporal stability in a thermal environment is also more excellent. On the other hand, by setting the content of the basic compound to the content of the reducing agent other than the hydroxylamine compound to 0.1 or more in terms of mass ratio, the residue removing performance and the temporal stability are more excellent.

Hereinafter, the amine compound other than the hydroxylamine compound and the quaternary ammonium hydroxide salt will be described, respectively, as the basic compound. Further, the quaternary ammonium hydroxide salt is not included in the amine compounds other than the hydroxylamine compound.

(Amine Compound Other than Hydroxylamine Compound)

In a view of more effectively suppressing a metal layer (preferably a metal layer including Co or a Co alloy) on a substrate from being corroded while securing residue removing performance, an amine compound having a cyclic structure is preferable as the amine compound other than the hydroxylamine compound.

In the amine compound having a cyclic structure, the amino group may be present in only any one or both of the cyclic structure and the cyclic structure.

Examples of the amine compound having a cyclic structure include tetrahydrofurfurylamine, N-(2-aminoethyl)piperazine, 1,8-diazabicyclo[5.4.0]-7-undecene, 1,4-diazabicyclo[2.2.2]octane, hydroxyethylpiperazine, piperazine, 2-methylpiperazine, trans-2,5-dimethylpiperazine, cis-2,6-dimethylpiperazine, 2-piperidinemethanol, cyclohexylamine, and 1,5-diazabicyclo[4.3.0]-5-nonene.

Among those, from the viewpoint of more effectively suppressing a metal layer (preferably a metal layer including Co or a Co alloy) on a substrate from being corroded while securing residue removing performance, tetrahydrofurfurylamine, N-(2-aminoethyl)piperazine, 1,8-diazabicyclo[5.4.0]-7-undecene, or 1,4-diazabicyclo[2.2.2]octane is preferable as the amine compound.

The content of the amine compound other than the hydroxylamine compound is preferably 0.1% to 50% by mass, and more preferably 0.5% to 30% by mass, with respect to the total mass of the treatment liquid. Further, the amine compound other than the hydroxylamine compound may be used singly or in combination of two or more kinds thereof. In a case where two or more kinds of the amine compounds other than the hydroxylamine compound are used in combination, the total content thereof is preferably within the range.

(Quaternary Ammonium Hydroxide Salt)

Examples of the quaternary ammonium hydroxide salt include a compound represented by Formula (a1).

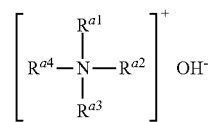

In Formula (a1), $R^{a1}$ to $R^{a4}$ each independently represent an alkyl group having 1 to 16 carbon atoms, an aryl group having 6 to 16 carbon atoms, an aralkyl group having 7 to 16 carbon atoms, or a hydroxyalkyl group having 1 to 16 carbon atoms. At least two of $R^{a1}$ to $R^{a4}$ together may be bonded to each other to form a cyclic structure. In particular, at least one of a combination of $R^{a1}$ and $R^{a2}$ or a combination of $R^{a3}$ and $R^{a4}$ may be bonded to each other to form a cyclic structure.

Among the compounds represented by Formula (a1), at least one selected from the group consisting of tetramethylammonium hydroxide, tetraethylammonium hydroxide, tetrapropylammonium hydroxide, tetrabutylammonium hydroxide, methyltripropylammonium hydroxide, methyltributylammonium hydroxide, ethyltrimethylammonium hydroxide, dimethyldiethylammonium hydroxide, benzyltrimethylammonium hydroxide, hexadecyltrimethylammonium hydroxide, (2-hydroxyethyl)trimethylammonium hydroxide, and spiro-(1,1')-bipyrrolidinium hydroxide is preferable in a view of easy availability. Among those, tetramethylammonium hydroxide, tetrabutylammonium hydroxide, or benzyltrimethylammonium hydroxide is more preferable.

The content of the quaternary ammonium hydroxide salt is preferably 0.05% to 10% by mass, and more preferably 0.1% to 5% by mass, with respect to the total mass of the treatment liquid. Further, the quaternary ammonium hydroxide salt may be used singly or in combination of two or more kinds thereof. In a case where two or more kinds of the quaternary ammonium hydroxide salts are used in combination, the total content thereof is preferably within the range.

Moreover, for the treatment liquid, each of the amine compound other than the hydroxylamine compound and the quaternary ammonium hydroxide salt may be used singly or in combination of two or more kinds thereof.

<Reducing Agent Other than Hydroxylamine Compound or Chelating Agent>

(Reducing Agent Other than Hydroxylamine Compound)

The reducing agent other than the hydroxylamine compound is not particularly limited, but reductive materials such as a compound having an OH group or a CHO group, and a compound containing a sulfur atom are preferable. The reducing agent has an oxidative action and has a function to oxidize OH⁻ ions, dissolved oxygen, or the like which causes the decomposition of the hydroxylamine compound.

Among the reductive materials such as a compound having an OH group or a CHO group, and a compound containing a sulfur atom, one selected from the group consisting of a compound represented by Formula (B), ascorbic acids, and a compound containing a sulfur atom is preferable from the viewpoint that the temporal stability of residue removing performance and the temporal stability in a thermal environment are more excellent.

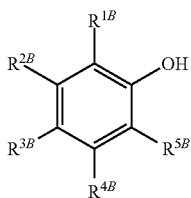

Formula (B)

In Formula (B), $R^{1B}$ to $R^{5B}$ each independently represent a hydrogen atom, a hydroxyl group, or a hydrocarbon group which may have a heteroatom. Further, in a case where $R^{1B}$ to $R^{5B}$ have a hydrocarbon group which may have a heteroatom, the hydrocarbon group may have a substituent.

In Formula (B), examples of the hydrocarbon group which may have a heteroatom represented by $R^{1B}$ to $R^{5B}$ include a hydrocarbon group and a hydrocarbon group having a heteroatom.

As the hydrocarbon group represented by $R^{1B}$ to $R^{5B}$, an alkyl group (preferably having 1 to 12 carbon atoms, and more preferably having 1 to 6 carbon atoms), an alkenyl group (preferably having 2 to 12 carbon atoms, and more preferably having 2 to 6 carbon atoms), an alkynyl group (preferably having 2 to 12 carbon atoms, and more preferably having 2 to 6 carbon atoms), an aryl group (preferably having 6 to 22 carbon atoms, more preferably having 6 to 14 carbon atoms, and still more preferably having 6 to 10 carbon atoms), and an aralkyl group (preferably having 7 to 23 carbon atoms, more preferably having 7 to 15 carbon atoms, and still more preferably having 7 to 11 carbon atoms).

Incidentally, examples of the hydrocarbon group having a heteroatom represented by $R^{1B}$ to $R^{5B}$ include the above-mentioned hydrocarbon groups in which —$CH_2$— is substituted with any one divalent group or a combination of a plurality of the divalent groups selected from the group consisting of —O—, —S—, —CO—, —$SO_2$—, and —$NR^a$—. $R^a$ represents a hydrogen atom or a hydrocarbon group having 1 to 20 carbon atoms (an alkyl group having 1 to 5 carbon atoms is preferable).

Furthermore, examples of the substituent include a hydroxyl group, a carboxyl group, or a substituted or unsubstituted amino group (as the substituent, an alkyl group having 1 to 6 carbon atoms is preferable, and an alkyl group having 1 to 3 carbon atoms is more preferable).

Examples of the compound represented by Formula (B) include gallic acid, resorcinol, ascorbic acid, tert-butylcatechol, catechol, isoeugenol, o-methoxyphenol, 4,4'-dihydroxyphenyl-2,2-propane, isoamyl salicylate, benzyl salicylate, methyl salicylate, and 2,6-di-tert-butyl-p-cresol.

Among the compounds represented by Formula (B), from the viewpoint of addition of reducing properties, the compounds having 2 or more hydroxyl groups are preferable, and the compounds having 3 or more hydroxyl groups are more preferable. The position for substitution of the hydroxyl group is not particularly limited, but among those, from the viewpoint of addition of reducing properties, $R^{1B}$ and/or $R^{2B}$ is preferable.

Examples of the compounds having 2 or more hydroxyl groups include catechol, resorcinol, tert-butylcatechol, and 4,4'-dihydroxyphenyl-2,2-propane. Further, examples of the compounds having 3 or more hydroxyl groups include gallic acid.

Moreover, examples of the ascorbic acids include ascorbic acid, isoascorbic acid, ascorbic acid sulfuric ester, ascorbic acid phosphoric ester, ascorbic acid 2-glucoside, ascorbyl palmitate, ascorbyl tetraisopalmitate, ascorbic acid isopalmitate, and salts thereof, and the ascorbic acid is preferable.

Moreover, examples of the compound containing a sulfur atom include mercaptosuccinic acid, dithiodiglycerol [$S(CH_2CH(OH)CH_2(OH))_2$], bis(2,3-dihydroxypropylthio) ethylene [$CH_2CH_2(SCH_2CH(OH)CH_2(OH))_2$], sodium 3-(2,3-dihydroxypropylthio)-2-methyl-propylsulfonate [$CH_2(OH)CH(OH)CH_2SCH_2CH(CH_3)CH_2SO_3Na$], 1-thioglycerol [$HSCH_2CH(OH)CH_2(OH)$], sodium 3-mercapto-1-propanesulfonate [$HSCH_2CH_2CH_2SO_3Na$], 2-mercaptoethanol [$HSCH_2CH_2(OH)$], thioglycolic acid [$HSCH_2CO_2H$], and 3-mercapto-1-propanol [$HSCH_2CH_2CH_2OH$]. Among these, a compound having a SH group (mercapto compound) is preferable, and 1-thioglycerol, sodium 3-mercapto-1-propanesulfonate, 2-mercaptoethanol, 3-mercapto-1-propanol, or thioglycolic acid is more preferable, and 1-thioglycerol or thioglycolic acid is still more preferable.

Furthermore, the reducing agent other than the hydroxylamine compound may be used singly or in combination of two or more kinds thereof.

(Chelating Agent)

The chelating agent means an acid capable of functioning as a chelate ligand, and preferably has one or more acid groups. The chelating agent as mentioned herein does not include the above-mentioned reducing agent other than the hydroxylamine. The acid group is not particularly limited, but the acid group is preferably at least one functional group selected from a carboxylic acid group, a sulfonic acid group, or a phosphonic acid group. The acid group has an excellent complexing property even at a pH of 10 or more.

The chelating agent has an oxidative action and forms a complex salt with a Fe ion which causes the decomposition of the hydroxylamine compound, and in addition, the oxidized metal included in the residues also forms a complex salt.

The chelating agent having a carboxylic acid group is not particularly limited, but examples thereof include a polyaminopolycarboxylic acid, aliphatic dicarboxylic acids, aliphatic polycarboxylic acids including a hydroxyl group, and ascorbic acids.

The polyaminopolycarboxylic acid is a compound having a plurality of amino groups and a plurality of carboxylic acid groups, and examples thereof include mono- or polyalkylenepolyaminepolycarboxylic acid, polyaminoalkanepolycarboxylic acid, polyaminoalkanolpolycarboxylic acid, and hydroxyalkyl etherpolyaminepolycarboxylic acid.

Examples of the polyaminopolycarboxylic acid include butylenediamine tetraacetic acid, diethylenetriamine pentaacetic acid (DTPA), ethylenediaminetetrapropionic acid, triethylenetetramine hexaacetic acid, 1,3-diamino-2-hydroxypropane-N,N,N',N'-tetraacetic acid, propylenediamine tetraacetic acid, ethylenediamine tetraacetic acid (EDTA), trans-1,2-diaminocyclohexane tetraacetic acid, ethylenediamine diacetic acid, ethylenediaminedipropionic acid, 1,6-hexamethylene-diamine-N,N,N',N'-tetraacetic acid, N,N-bis (2-hydroxybenzyl)ethylenediamine-N,N-diacetic acid, diaminopropane tetraacetic acid, 1,4,7,10-tetraazacyclododecane-tetraacetic acid, diaminopropanol tetraacetic acid, and (hydroxyethyl)ethylenediamine triacetic acid. Among those, diethylenetriamine pentaacetic acid (DTPA), ethylenediamine tetraacetic acid (EDTA), or trans-1,2-diaminocyclohexane tetraacetic acid is preferable.

Examples of the aliphatic dicarboxylic acids include oxalic acid, malonic acid, succinic acid, and maleic acid, and the oxalic acid, the malonic acid, or the succinic acid is preferable.

Examples of the aliphatic polycarboxylic acids including a hydroxyl group include malic acid, tartaric acid, and citric acid, and the citric acid is preferable.

The chelating agent having a sulfonic acid group is not particularly limited, but, for example, methanesulfonic acid is preferable.

The chelating agent having a phosphonic acid group is not particularly limited, but examples thereof include methyldiphosphonic acid, aminotri(methylenephosphonic acid), 1-hydroxyethylidene-1,1-diphosphonic acid, nitrilotrismethylenephosphonic acid (NTMP), ethylenediamine tetrakis(methylenephosphonic acid) (EDTPO), hexamethylenediamine tetra(methylenephosphonic acid), propylenediamine tetra(methylenephosphonic acid), diethylenetriamine penta(methylenephosphonic acid), triethylenetetramine hexa(methylenephosphonic acid), triaminotriethylamine hexa(methylenephosphonic acid), trans-1,2-cyclohexanediamine tetra(methylenephosphonic acid), glycol etherdiamine tetra(methylenephosphonic acid) and tetraethylenepentamine hepta(methylenephosphonic acid), and glycine-N,N-bis(methylenephosphonic acid) (Glyphosine). Among these, NTMP is preferable.

Moreover, the chelating agent may be used singly or in combination of two or more kinds thereof.

The content of the reducing agent other than the hydroxylamine compound or the chelating agent (in a case where the reducing agent other than the hydroxylamine compound and the chelating agent are used in combination, the total content thereof) is usually 0.05% to 10% by mass with respect to the total mass of the treatment liquid, and from the viewpoint that the temporal stability of residue removing performance is more excellent, the lower limit thereof is preferably 0.1% by mass or more, and more preferably 2.5% by mass or more. Among those, the content of the reducing agent other than the hydroxylamine compound or the chelating agent (in a case where the reducing agent other than the hydroxylamine compound and the chelating agent are used in combination, the total content thereof) is more preferably 2.5% to 8% by mass with respect to the total mass of the treatment liquid.

<Corrosion Inhibitor>

The treatment liquid of the embodiment of the present invention preferably contains a corrosion inhibitor. The corrosion inhibitor has a function of alleviating the over-etching of a metal layer (for example, a metal layer including Co or a Co alloy) which serves as a wiring film. Incidentally, the corrosion inhibitor as mentioned herein does not include the reducing agent other than the hydroxylamine, and the chelating agent as mentioned above.

The corrosion inhibitor is not particularly limited, but examples thereof include 1,2,4-triazole (TAZ), 5-aminotetrazole (ATA), 5-amino-1,3,4-thiadiazole-2-thiol, 3-amino-1H-1,2,4-triazole, 3,5-diamino-1,2,4-triazole, 3-amino-5-mercapto-1,2,4-triazole, 1-amino-1,2,4-triazole, 1-amino-1,2,3-triazole, 1-amino-5-methyl-1,2,3-triazole, 3-mercapto-1,2,4-triazole, 3-isopropyl-1,2,4-triazole, 1H-tetrazole-5-acetic acid, 2-mercaptobenzothiazole (2-MBT), 1-phenyl-2-tetrazoline-5-thione, 2-mercaptobenzimidazole (2-MBI), 4-methyl-2-phenylimidazole, 2-mercaptothiazoline, 2,4-diamino-6-methyl-1,3,5-triazine, thiazole, imidazole, benzimidazole, triazine, methyltetrazole, bismuthiol I, 1,3-dimethyl-2-imidazolidinone, 1,5-pentamethylenetetrazole, 1-phenyl-5-mercaptotetrazole, diaminomethyltriazine, imidazolinethione, 4-methyl-4H-1,2,4-triazole-3-thiol, 5-amino-1,3,4-thiadiazole-2-thiol, benzothiazole, 2,3,5-trimethylpyrazine, 2-ethyl-3,5-dimethylpyrazine, quinoxaline, acetylpyrrole, pyridazine, and pyrazine.

In addition to those mentioned above, benzotriazoles are also preferable as the corrosion inhibitor. Examples of the benzotriazoles include benzotriazole (BTA), 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenylbenzo-triazole, 5-nitrobenzotriazole, 4-nitrobenzotriazole, 3-amino-5-mercapto-1,2,4-triazole, 2-(5-amino-pentyl)-benzotriazole, 1-aminobenzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butylbenzotriazole, 5-(1',1'-dimethylpropyl)-benzotriazole, 5-(1',1',3'-trimethylbutyl)benzotriazole, 5-n-octylbenzotriazole, and 5-(1',1',3',3'-tetramethylbutyl)benzotriazole.

Among those, from the viewpoint of further improving the anticorrosion performance, a compound represented by Formula (A) is preferable as the corrosion inhibitor.

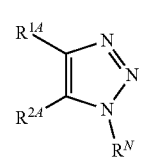

Formula (A)

In Formula (A), $R^{1A}$, $R^{2A}$, and $R^N$ each independently represent a hydrogen atom, or a substituted or unsubstituted hydrocarbon group. Further, $R^{1A}$ and $R^{2A}$ may be bonded to each other to form a ring.

In Formula (A), as the hydrocarbons represented by $R^{1A}$ and $R^{2A}$, an alkyl group (preferably having 1 to 12 carbon atoms, more preferably having 1 to 6 carbon atoms, and still more preferably having 1 to 3 carbon atoms), an alkenyl group (preferably having 2 to 12 carbon atoms, and more preferably having 2 to 6 carbon atoms), an alkynyl group (preferably having 2 to 12 carbon atoms, and more preferably having 2 to 6 carbon atoms), an aryl group (preferably having 6 to 22 carbon atoms, more preferably having 6 to 14 carbon atoms, and still more preferably having 6 to 10 carbon atoms), and an aralkyl group (preferably having 7 to 23 carbon atoms, more preferably having 7 to 15 carbon atoms, and still more preferably having 7 to 11 carbon atoms).

In addition, the substituent is not particularly limited, but examples thereof include a hydroxyl group, a carboxyl group, and a substituted or unsubstituted amino group (as a substituent, an alkyl group having 1 to 6 carbon atoms is preferable, and an alkyl group having 1 to 3 carbon atoms is more preferable).

Furthermore, $R^{1A}$ and $R^{2A}$ may be bonded to each other to form a ring, and examples of the ring include a benzene ring and a naphthalene ring. In a case where $R^{1A}$ and $R^{2A}$ are bonded to each other to form a ring, they may further have a substituent (for example, a hydrocarbon group having 1 to 5 carbon atoms and a carboxyl group).

Examples of the compound represented by Formula (A) include 1H-1,2,3-triazole, benzotriazole, carboxybenzotriazole, and 5-methyl-1H-benzotriazole.

The content of the corrosion inhibitor in the treatment liquid is preferably 0.01% to 10% by mass, and more preferably 0.05% to 5% by mass, with respect to the total mass of the treatment liquid. Further, the corrosion inhibitor may be used singly or in combination of two or more kinds thereof. In a case where two or more kinds of the corrosion inhibitors are used in combination, the total content thereof is preferably within the range.

<Water>

The treatment liquid of the embodiment of the present invention preferably contains water.

The content of water in the treatment liquid of the embodiment of the present invention is not particularly limited, and is any of 1% to 99.999% by mass with respect to the total mass of the treatment liquid.

<Organic Solvent>

The treatment liquid of the embodiment of the present invention preferably contains an organic solvent.

As the organic solvent, all of known organic solvents can be used, but a hydrophilic organic solvent is preferable. The hydrophilic organic solvent means an organic solvent which can be uniformly mixed with water at any ratio.

Specific examples of the hydrophilic organic solvent include a water-soluble alcohol-based solvent, a water-soluble ketone-based solvent, a water-soluble ester-based solvent, a water-soluble ether-based solvent (for example, glycol diether), a sulfone-based solvent, a sulfonic acid-based solvent, a sulfoxide-based solvent, a nitrile-based solvent, and an amide-based solvent, and in order to obtain a desired effect of the present invention, all of those solvents can be used.

Examples of the water-soluble alcohol-based solvent include an alkanediol (including, for example, alkylene glycol), an alkoxyalcohol (including, for example, glycol monoether), a saturated aliphatic monohydric alcohol, an unsaturated non-aromatic monohydric alcohol, and a low-molecular-weight alcohol including a ring structure.

Examples of the alkanediol include glycol, 2-methyl-1,3-propanediol, 1,3-propanediol, 2,2-dimethyl-1,3-diol, 1,4-butanediol, 1,3-butanediol, 1,2-butanediol, 2,3-butanediol, pinacol, and alkylene glycol.

Examples of the alkylene glycol include ethylene glycol, propylene glycol, diethylene glycol, dipropylene glycol, triethylene glycol, and tetraethylene glycol.

Examples of the alkoxyalcohol include 3-methoxy-3-methyl-1-butanol, 3-methoxy-1-butanol, 1-methoxy-2-butanol, and glycol monoether.

Examples of the glycol monoether include ethylene glycol monomethyl ether, ethylene glycol monoethyl ether, ethylene glycol mono-n-propyl ether, ethylene glycol monoisopropyl ether, ethylene glycol mono-n-butyl ether, diethylene glycol monomethyl ether, diethylene glycol monoethyl ether, diethylene glycol monobutyl ether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of the saturated aliphatic monohydric alcohol include methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of the unsaturated non-aromatic monohydric alcohol include allyl alcohol, propargyl alcohol, 2-butenyl alcohol, 3-butenyl alcohol, and 4-penten-2-ol.

Examples of the low-molecular-weight alcohol including a ring structure include tetrahydrofurfuryl alcohol, furfuryl alcohol, and 1,3-cyclopentanediol.

Examples of the water-soluble ketone-based solvent include acetone, propanone, cyclobutanone, cyclopentanone, cyclohexanone, diacetone alcohol, 2-butanone, 5-hexanedione, 1,4-cyclohexanedione, 3-hydroxyacetophenone, 1,3-cyclohexanedione, and cyclohexanone.

Examples of the water-soluble ester-based solvent include ethyl acetate, glycol monoesters such as ethylene glycol monoacetate and diethyleneglycol monoacetate, and glycol monoether monoesters such as propylene glycol monomethyl ether acetate, ethylene glycol monomethyl ether acetate, propylene glycol monoethyl ether acetate, and ethylene glycol monoethyl ether acetate.

Among those, ethylene glycol monobutyl ether, tri(propylene glycol) methyl ether, and diethylene glycol monoethyl ether are preferable.

Examples of the sulfone-based solvent include sulfolane, 3-methyl sulfolane, and 2,4-dimethyl sulfolane.

Examples of the sulfoxide-based solvent include dimethyl sulfoxide.

Examples of the nitrile-based solvent include acetonitrile.

Examples of the amide-based solvent include N,N-dimethylformamide, 1-methyl-2-pyrrolidone, 2-pyrrolidinone, 1,3-dimethyl-2-imidazolidinone, ε-caprolactam, formamide, N-methylformamide, acetamide, N-methylacetamide, N,N-dimethylacetamide, N-methylpropaneamide, and hexamethylphosphoric triamide.

As the sulfonic acid-based solvent, an organic sulfonic acid-based solvent is preferable, and examples thereof include methanesulfonic acid.

Among the hydrophilic organic solvents, from the viewpoint of further improving the temporal stability of residue removing performance and the anticorrosion properties, the water-soluble alcohol-based solvent, the sulfone-based solvent, the amide-based solvent, the sulfonic acid-based solvent, or the sulfoxide-based solvent is preferable, and the water-soluble alcohol-based solvent or the sulfoxide-based solvent are more preferable.

The content of the organic solvent is not particularly limited, but is typically 20% to 98% by mass.

The organic solvent may be used singly or in combination of two or more kinds thereof. In a case where two or more kinds of the organic solvents are used in combination, the total amount thereof is preferably within the above-mentioned range.

The treatment liquid of the embodiment of the present invention can have a liquid property in any of a water-based formulation (the content of water>the content of the organic solvent) and an organic solvent-based formulation (the content of water<the content of the organic solvent) by adjustment of the content of water and the content of the organic solvent.

Since water can cause the decomposition of the hydroxylamine compound in the treatment liquid, it is preferable that the treatment liquid of the embodiment of the present invention contains an organic solvent, and it is more preferable that the organic solvent is contained in the amount of 45% by mass or more with respect to the total mass of the treatment liquid.

For the treatment liquid, from the viewpoint of the decomposition of residues of an organic substance, it is preferable that organic solvent is used in combination with water, and the composition is preferably as follows: the content of water is 1% to 50% by mass and the content of the organic solvent is 45% to 98% by mass, with respect to the total mass of the treatment liquid. In a case of adopting the composition, from the viewpoint of further improving the residue removing performance, it is preferable that the content of water is 4% to 45% by mass with respect to the total mass of the treatment liquid. Further, the treatment liquid may be prepared as a concentrate as described later. In a case where the treatment liquid is prepared as the concentrate, the concentration rate thereof is appropriately determined according to the composition to be configured, but it is preferable that the content of water and the content of the organic solvent are the above-mentioned contents upon use.

(Other Additives)

In addition, examples of such other additives include a surfactant, a defoamer, a rust inhibitor, and a preservative.

<Coarse Particles>

It is preferable that the treatment liquid of the embodiment of the present invention substantially does not include coarse particles.

The coarse particles refer to particles having a diameter of 0.2 μm or more, for example, in a case of considering the shapes of the particles as spheres. Further, the expression, substantially not including coarse particles, indicates that the number of particles in a diameter of 0.2 μm or more in 1 mL of the treatment liquid in a case where measurement of the treatment liquid using a commercially available measuring device in a light scattering type in-liquid particle measurement method system is carried out is 10 or less.

Furthermore, the coarse particles included in the treatment liquid are particles of dusts, organic solids, inorganic solids, or the like which are included as impurities in raw materials, or particles of dusts, organic solids, inorganic solids, or the like which are incorporated as a contaminant during the preparation of a treatment liquid, and correspond to the particles which are not ultimately dissolved in the treatment liquid and present as particles.

The amount of the coarse particles present in the treatment liquid can be measured in the liquid phase using a commercially available measuring device in a light scattering type in-liquid particle measurement system with a laser as a light source.

Examples of a method for removing the coarse particles include a treatment such as filtering which will be described later.

<Metal Concentration>

The treatment liquid in the embodiment of the present invention preferably has any of ion concentrations of metals (metal elements such as Fe, Co, Na, K, Ca, Cu, Mg, Mn, Li, Al, Cr, Ni, and Zn) of 5 ppm or less (preferably 1 ppm or less) included as impurities in the liquid. In particular, in a view that high-purity treatment liquids are further demanded in the manufacture of advanced semiconductor elements, it is more preferable that the metal concentration is less than a value in a ppm order, that is, a value in a ppb order or less, and it is still more preferable that the metal concentration is in a ppt order (any of the concentrations are based on mass), and it is particularly preferably that the metal is substantially free.

Examples of a method for reducing the metal concentration include sufficiently performing distillation or filtering using an ion exchange resin in at least one step of a step using raw materials used in the production of a treatment liquid or a step after preparation of the treatment liquid.

Examples of a method other than the method for reducing the metal concentration include use of a container having little elution of impurities as shown in the section describing a container housing the treatment liquid with regard to a "container" housing raw materials used in the production of a treatment liquid. Other examples of the method include a method of carrying out lining of a fluorine-based resin for an inner wall of a "pipe" so as to prevent the elution of metal fractions from the pipe or the like during the preparation of the treatment liquid.

<Physical Properties of Treatment Liquid>

The pH of the treatment liquid of the embodiment of the present invention is 10 or more. By setting the pH of the treatment liquid in the alkali region, the residue removing performance is excellent.

From the viewpoint of exhibiting more excellent residue removing performance, the pH of the treatment liquid is preferably 11 or more, and more preferably 12 or more.

The pH of the treatment liquid can be measured using a known pH meter.

<Applications>

The treatment liquid of the embodiment of the present invention is a treatment liquid for a semiconductor device. In the present invention, the expression, "for a semiconductor device" means a use in the manufacture of a semiconductor device. The treatment liquid of the embodiment of the present invention can also be used in any steps for manufacturing a semiconductor device, and can also be used in, for example, a treatment of a substrate after chemical mechanical polishing, in addition to a treatment of an insulating film, a resist, or an antireflection film, which is present on a substrate, a treatment of dry etching residues (residues of a photoresist film, residues of a metal hard mask, and the like), and a treatment of ashing residues.

With regard to more specific applications of the treatment liquid, the treatment liquid is used as a pre-wet liquid applied on a substrate in order to improve the coatability of an actinic ray-sensitive or radiation-sensitive composition before a step of forming a photoresist film using the composition; a washing liquid used for removal of residues such as dry etching residues, or the like; a solution (for example, a removing liquid and a peeling liquid) used for removal of various resist films (preferably a photoresist film) used for the formation of a pattern; and a solution (for example, a removing liquid and a peeling liquid) used for removal of a permanent film (for example, a color filter, a transparent insulating film, and a resin-made lens) or the like from a substrate. Further, the treatment liquid can also be used as a developer for various actinic ray-sensitive or radiation-sensitive resin composition layers for the formation of a pattern. In addition, the treatment liquid can also be used as a washing liquid for removal of residues such as metal impurities and fine particles from a substrate after chemical mechanical polishing. The substrate after removal of a permanent film may be used again in a use of a semiconductor device, and therefore, the removal of the permanent film is included in the step of manufacturing a semiconductor device.

Among those applications, the treatment liquid can also be particularly used as the washing liquid for removing dry etching residues, the solution for removal of various resist films used for the formation of a pattern, or the washing liquid for removing residues from a substrate after chemical mechanical polishing.

The treatment liquid of the embodiment of the present invention may be used only in one or two or more of the applications.

As miniaturization and high functionalization of semiconductor devices proceed in recent years, metals used for wiring materials, plug materials, or the like are required to be more electrically conductive. For example, it is predicted that substitution of aluminum (Al) and copper (Cu) in the metals used as the wiring material with cobalt (Co) proceeds. In addition, it is expected that in addition to tungsten (W) in the metals used as the plug materials, a demand for Co increases.

As a result, less corrosion with W and Co is required as characteristics of the treatment liquid, and in particular, less corrosion with Co is required.

The treatment liquid of the embodiment of the present invention is preferably used as a treatment liquid for the manufacture of a semiconductor device including a substrate comprising a metal layer including Co or a Co alloy.

[Method for Producing Treatment Liquid]

<Method for Preparing Treatment Liquid>

The treatment liquid can be produced by a known method.

Hereinafter, a method for producing the treatment liquid will be described in detail.

(Step of Purifying Raw Materials)

In the production of the treatment liquid, it is preferable that any one or more of raw materials for preparation of a treatment liquid is purified by distillation, ion exchange, or filtering in advance. As for the degree of purification, the purification is preferably performed, for example, to a purity of 99% or more of the raw materials, and more preferably performed to a purity of 99.9% or more.

The purification method is not particularly limited, but examples thereof include a method including passage through an ion exchange resin or a reverse osmosis membrane (RO membrane), or the like, and a method of distillation, filtering which will be described later, or the like. Specific examples of the method include a method in which a primary purification is performed by passage through a reverse osmosis membrane or the like, cation exchange resins, anion exchange resins, and then a secondary purification is carried out by passage through a purification device including a cation exchange resin, an anion exchange resin, or a mixed bed ion exchange resin.

Incidentally, for the purification treatment, a plurality of the above-mentioned known purification methods may be carried out in combination.

In addition, the purification treatments may be carried out a plurality of times.

(Filtering)

The filter is not particularly limited as long as it is a filter which has been used in the filtering applications or the like from the related art. Examples thereof include a filter formed with a fluorine resin such as polytetrafluoroethylene (PTFE) and a tetrafluoroethylene-perfluoroalkyl vinyl ether copolymer (PFA), a polyamide-based resin such as nylon, and a polyolefin resin (including a high-density polyolefin and an ultrahigh-molecular-weight polyolefin) such as polyethylene and polypropylene (PP), or the like. Among these materials, a material selected from the group consisting of the polyethylene, the polypropylene (including a high-density polypropylene), the fluorine resin such as PTFE and PFA, and the polyamide-based resin such as nylon is preferable, and among these, a filter with a fluorine resin such as PTFE and PFA is more preferable. By using a filter formed with these materials, high-polarity foreign matters which are likely to cause residue defects or particle defects can be more effectively removed.

The critical surface tension of the filter is preferably 70 mN/m or more, more preferably 95 mN/m or less, and still more preferably from 75 mN/m to 85 mN/m. Further, the value of the critical surface tension is a nominal value of a manufacturer. By using a filter having a critical surface tension in the range, high-polarity foreign matters which are likely to cause defects can be more effectively removed.

The pore diameter of the filter is preferably approximately 2 to 20 nm, and more preferably 2 to 15 nm. By adjusting the pore diameter of the filter to be in the range, it is possible to reliably remove fine foreign matters such as impurities and aggregates included in the raw materials while suppressing clogging in filtering.

In a case of using filters, different filters may be combined. At that time, the filtering with the first filter may be performed once or twice or more times. In a case where the filtering is performed twice or more times by combining different filters, the pore diameter at the second filtering or later is preferably the same as or smaller than the pore diameter at the first filtering. In addition, the first filters with different pore diameters in the above-mentioned range may be combined. Here, with regard to the pore diameters, reference can be made to nominal values of filter manufacturers. A commercially available filter may be selected from various filters provided by Nihon Pall Ltd., Advantech Toyo Roshi Kaisha., Ltd., Nihon Entegris K. K. (formerly Nippon Microlith Co., Ltd.), Kitz Micro Filter Corporation, or the like, for example. Further, a polyamide-made P-nylon Filter (pore diameter of 0.02 μm, critical surface tension of 77 mN/m)"; (manufactured by Nihon Pall Ltd.), a high-density polyethylene-made "PE•clean filter (pore diameter of 0.02 μm)"; (manufactured by Nihon Pall Ltd.), and a high-density polyethylene-made "PE•clean filter (pore diameter of 0.01 μm)"; (manufactured by Nihon Pall Ltd.) can also be used.

As the second filter, a filter formed of the same materials as those of the above-mentioned first filter, and the like can be used. The pore diameter of the second filter is preferably approximately 1 to 10 nm.

Moreover, in the present invention, the filtering step is preferably performed at room temperature (25° C.) or lower, more preferably performed at 23° C. or lower, and still more preferably performed at 20° C. or lower. Further, the temperature is preferably 0° C. or higher, more preferably 5° C. or higher, and still more preferably 10° C. or higher.

In the filtering step, particulate foreign matters or impurities can be removed, but in a case of performing the filtering at the temperature, the amounts of the particulate foreign matters and/or impurities dissolved in the raw materials are reduced, and therefore, they are efficiently removed by filtering.

(Liquid Preparing Step)

The preparation of the treatment liquid of the embodiment of the present invention is not particularly limited, and the treatment liquid can be produced by mixing the above-mentioned respective components, for example. The order and/or timing for mixing the above-mentioned respective components is not particularly limited, and examples thereof include a method in which a hydroxylamine compound is dispersed in advance in water having a pH adjusted, and predetermined components are sequentially mixed.

<Kit and Concentrate>

The treatment liquid in the embodiment of the present invention may be used in the form of a kit having raw materials of the treatment liquid divided into a plurality of parts.

Although not being particularly limited, examples of a specific method for using the treatment liquid in the form of the kit include an aspect in which a liquid composition containing a hydroxylamine compound and a basic compound in water is prepared as a first liquid, and a liquid composition containing a reducing agent in an organic solvent is prepared as a second liquid.

In addition, the treatment liquid may be prepared as a concentrate. In a case where the treatment liquid is in the form of a concentrate, the concentration rate is appropriately determined by the composition for constitution, but is preferably 5 to 2,000 folds. That is, the treatment liquid is used after dilution to 5 to 2,000 folds. Further, from the viewpoint of further improving the temporal stability of the residue removing performance, it is preferable that the treatment liquid is diluted with water. That is, in the concentrate, it is preferable that water which causes the decomposition of the hydroxylamine compound is reduced as much as possible to provide a composition including a large amount of the organic solvent (preferably in the amount of 45% by mass or more with respect to the total mass of the treatment liquid).

<Container (Housing Container)>

The treatment liquid of the embodiment of the present invention can be filled in any container as long as the container does not have any problem such as corrosion properties (irrespective of whether the treatment liquid is a kit or a concentrate), stored, transported, and used. As for the container, as a container used in semiconductor applications, a container which has high cleanliness in the container and less elution of impurities is preferable. Examples of the usable container include, but are not limited to, "CLEAN BOTTLE" series (manufactured by Aicello Chemical Co., Ltd.) and "PURE BOTTLE" (manufactured by Kodama Plastics Co., Ltd.). The inner wall of the container is preferably formed of one or more resins selected from the group consisting of a polyethylene resin, a polypropylene resin, and a polyethylene-polypropylene resin, other resins, and a metal which has been antirust and metal elution preventing treatments, such as stainless steel, Hastelloy, Inconel, and Monel.

As such other resins, a fluorine-based resin (perfluoro resin) is preferable. In this manner, by using a container having an inner wall formed of a fluorine-based resin, occurrence of a problem of elution of ethylene or propylene oligomers can be suppressed, as compared with a container having an inner wall formed of a polyethylene resin, a polypropylene resin, or a polyethylene-polypropylene resin.

Specific examples of such a container having an inner wall which is a fluorine-based resin include a Fluoro-PurePFA composite drum manufactured by Entegris Inc. Further, the containers described in page 4 and the like of JP1991-502677A (JP-H03-502677A), page 3 and the like of WO2004/016526A, pages 9 and 16 of WO99/046309A, or the like can also be used.

Moreover, for the inner wall of the container, the quartz and the electropolished metal material (that is, the metal material which has been completely electropolished) are also preferably used, in addition to the above-mentioned fluorine-based resin.

The electropolished metal material is preferably a metal material which contains at least one selected from the group consisting of chromium and nickel, and has a total content of chromium and nickel of more than 25% by mass with respect to the total mass of the metal material. Examples of the metal material include stainless steel and a nickel-chromium alloy.

The total content of chromium and nickel in the metal material is more preferably 30% by mass or more, with respect to the total mass of the metal material.

In addition, the upper limit value of the total content of chromium and nickel in the metal material is not particularly limited, but in general, it is preferably 90% by mass or less.

The stainless steel is not particularly limited, and known stainless steel can be used. Among those, an alloy containing 8% by mass or more of nickel is preferable, and austenitic stainless steel containing 8% by mass or more of nickel is more preferable. Examples of the austenitic stainless steel include Steel Use Stainless (SUS) 304 (Ni content of 8% by mass, Cr content of 18% by mass), SUS 304L (Ni content of 9% by mass, Cr content of 18% by mass), SUS 316 (Ni content of 10% by mass, Cr content of 16% by mass), and SUS 316L (Ni content of 12% by mass, Cr content of 16% by mass).

The nickel-chromium alloy is not particularly limited and a known nickel-chromium alloy can be used. Among those, a nickel-chromium alloy having a nickel content of 40% to 75% by mass and a chromium content of 1% to 30% by mass is preferable.

Examples of the nickel-chromium alloy include Hastelloy (trade name, hereinafter, the same shall apply), Monel (trade name, hereinafter, the same shall apply), and Inconel (trade name, hereinafter, the same shall apply). More specific examples thereof include Hastelloy C-276 (Ni content of 63% by mass, Cr content of 16% by mass), Hastelloy C (Ni content of 60% by mass, Cr content of 17% by mass), and Hastelloy C-22 (Ni content of 61% by mass, Cr content of 22% by mass).

In addition, the nickel-chromium alloy may further contain boron, silicon, tungsten, molybdenum, copper, cobalt, or the like, as desired, in addition to the above-mentioned alloys.

The method of electropolishing the metal material is not particularly limited, and known methods can be used. For example, the methods described in paragraphs [0011] to [0014] of JP2015-227501A, paragraphs [0036] to [0042] of JP2008-264929A, or the like can be used.

It is presumed that the metal material has a larger content of chromium in the passivation layer on the surface than the content of chromium in the parent phase by electropolishing the metal material. As a result, it is presumed that since it is difficult for the metal elements to flow into the treatment liquid from the inner wall coated with the electropolished metal material, it is possible to obtain a treatment liquid having a reduced amount of metal impurities.

In addition, it is preferable that the metal material is buffed. The buffing method is not particularly limited, and known methods can be used. The size of the abrasive grain used to finish the buffing is not particularly limited, but is preferably #400 or less in view that the unevenness of the surface of the metal material is likely to be smaller.

Incidentally, buffing is preferably performed before the electropolishing.

In addition, the metal material may be subjected to a treatment including one of buffing, acid washing, magnetic fluid polishing, and the like or a combination of two or more thereof in a plurality of steps that are performed by changing the number of a size or the like of the abrasive grains.

In the present invention, the container, and the treatment liquid housed in the container may be referred to as a treatment liquid receptor in some cases.

The inside of these containers is preferably washed before the treatment liquid is filled. For the liquid used for the washing, the amount of the metal impurities in the liquid is preferably reduced. The treatment liquid of the embodiment of the present invention may be bottled in a container such as a gallon bottle and a coated bottle after the production, transported, and stored.

In order to prevent the change in the components in the treatment liquid during the storage, the inside of the container may be replaced with inert gas (nitrogen, argon, or the like) with a purity of 99.99995% by volume or more. In particular, a gas having a low moisture content is preferable. In addition, during the transportation and the storage, the temperature may be controlled to a normal temperature in the range of −20° C. to 20° C. to prevent deterioration.

(Clean Room)

It is preferable that handlings including production of the treatment liquid of the embodiment of the present invention, opening and/or washing of a housing container, filling of the treatment liquid, and the like, treatment analysis, and measurements are all performed in clean rooms. The clean rooms preferably satisfy 14644-1 clean room standards. It is preferable to satisfy any one of International Standards Organization (ISO) Class 1, ISO Class 2, ISO Class 3, or ISO Class 4, it is more preferable to satisfy either ISO Class 1 or ISO Class 2, and it is still more preferable to satisfy ISO Class 1.

[Method for Washing Substrate]

The method for washing a substrate of an embodiment of the present invention has a washing step (hereinafter referred to as a "washing step B") in which a substrate comprising a metal layer including Co or a Co alloy is washed using the treatment liquid. Further, the method for washing a substrate of the embodiment of the present invention may have a treatment liquid preparing step (hereinafter referred to as "a treatment liquid preparing step A") in which the treatment liquid is prepared before the washing step B.

In the following description of the method for washing a substrate, a case where the treatment liquid preparing step A is carried out before the washing step B is presented by way of an example, but is not restrictive, and the method for washing a substrate of the embodiment of the present invention may be performed using the treatment liquid that has been prepared in advance.

<Washing Target>

The washing target of the method for washing a substrate of the embodiment of the present invention is not particularly limited as long as it is a substrate comprising a metal layer including Co or a Co alloy. Examples of the washing target of the method for washing a substrate of the embodiment of the present invention include a laminate comprising at least the metal layer including Co or a Co alloy (hereinafter simply referred to as a "metal layer"), an interlayer insulating layer, and a metal hard mask in this order on a substrate. The laminate may have holes formed toward the substrate from the surface (apertures) of the metal hard mask so as to expose the surface of the metal layer through a dry etching step or the like.

A method for producing a laminate having holes as described above is not particularly limited, but common examples thereof include a method in which a laminate before the treatment, having a substrate, a metal layer, an interlayer insulating layer, and a metal hard mask in this order, is subjected to a dry etching step using the metal hard mask as a mask, and the interlayer insulating layer is etched so as to expose the surface of the metal layer to provide holes passing through the inside of the metal hard mask and the interlayer insulating layer.

Furthermore, a method for producing the metal hard mask is not particularly limited, and examples thereof include a method in which a metal layer including predetermined components is firstly formed on an interlayer insulating layer, a resist film having a predetermined pattern is formed thereon, and then the metal layer is etched using the resist film as a mask to produce a metal hard mask (that is, a film with a metal layer that is patterned).

In addition, the laminate may have layers other than the above-mentioned layer, and examples of such other layers include an etching stop layer and an antireflection layer.

FIG. 1 illustrates a schematic cross-sectional view showing an example of a laminate which is a washing target in the method for washing a substrate of the embodiment of the present invention.

A laminate 10 shown in FIG. 1 comprises a metal layer 2, an etching stop layer 3, an interlayer insulating layer 4, and a metal hard mask 5 in this order on a substrate 1, and has holes 6 formed by a dry etching step, through which the metal layer 2 is exposed at predetermined positions. That is, the washing target shown in FIG. 1 is a laminate comprising the substrate 1, the metal layer 2, the etching stop layer 3, the interlayer insulating layer 4, and the metal hard mask 5 in this order, and comprising the holes 6 passing through the surface of the metal hard mask 5 at aperture positions thereof to the surfaces of the metal layer 2. The inner wall 11 of the hole 6 is formed of a cross-sectional wall 11a including the etching stop layer 3, the interlayer insulating layer 4, and the metal hard mask 5, and a bottom wall 11b including the exposed metal layer 2, and dry etching residues 12 adhere thereto.

The method for washing a substrate of the embodiment of the present invention can be suitably used in washing intended to remove the dry etching residues 12. That is, the performance for removing the dry etching residues 12 is excellent, and the anticorrosion properties for the inner wall 11 (for example, the metal layer 2) of the washing target are also excellent.

In addition, the method for washing a substrate of the embodiment of the present invention may also be carried out for the laminate which has been subjected to a dry ashing step after the dry etching step.

Hereinafter, the respective layer constituent materials of the above-mentioned laminate will be described.

(Metal Hard Mask)

It is preferable that the metal hard mask contains at least one component selected from the group consisting of Cu, Co, W, $AlO_x$, AlN, $AlO_xN_y$, $WO_x$, Ti, TiN, $ZrO_x$, $HfO_x$, or TaOx. Here, x and y each numbers represented by x=1 to 3 and y=1 to 2, respectively.

Examples of the materials of the metal hard mask include TiN, $WO_2$, and $ZrO_2$.

(Interlayer Insulating Layer)

A material for the interlayer insulating layer is not particularly limited, and examples thereof include a material, preferably having a dielectric constant k of 3.0 or less, and more preferably having a dielectric constant k of 2.6 or less.

Specific examples of the material for the interlayer insulating layer include $SiO_2$— and SiOC-based materials, and organic polymers such as a polyimide.

(Etching Stop Layer)

A material for the etching stop layer is not particularly limited. Specific examples of the material for the etching stop layer include SiN-, SiON-, and SiOCN-based materials, and metal oxides such as $AlO_x$.

(Metal Layer)

A wiring material forming the metal layer contains at least cobalt (Co). Incidentally, Co may be an alloy (Co alloy) with another metal.

The wiring material of the present invention may further contain metals other than Co, metal nitride, or an alloy. Specific examples thereof include copper, titanium, titanium-tungsten, titanium nitride, tungsten, tantalum, tantalum compounds, chromium, chromium oxide, and aluminum.

(Substrate)

Examples of the "substrate" as mentioned herein include a semiconductor substrate including a single layer and a semiconductor substrate including multiple layers.

A material constituting the semiconductor substrate including a single layer is not particularly limited, and in general, the semiconductor substrate is preferably formed of silicon, silicon germanium, Group III to V compounds such as GaAs, and any combinations thereof.

In a case of the semiconductor substrate including multiple layers, its configuration is not particularly limited, and the substrate may have, for example, exposed integrated circuit structures such as interconnect structures (interconnect features) such as a metal wire and a dielectric material on the semiconductor substrate such as silicon as described above. Examples of the metals and the alloys used in the interconnect structures include, but are not limited to, aluminum, aluminum alloyed with copper, copper, titanium, tantalum, cobalt, silicon, titanium nitride, tantalum nitride, and tungsten. Further, there may be an interlayer dielectric layer, a silicon oxide layer, a silicon nitride layer, a silicon carbide layer, a carbon-doped silicon oxide layer, or the like on the semiconductor substrate.

Hereinafter, the treatment liquid preparing step A and the washing step B will be described, respectively, in detail.

(Treatment Liquid Preparing Step A)

The treatment liquid preparing step A is a step of preparing the treatment liquid. The respective components used in the present step are as described above.

The procedure in the present step is not particularly limited, and examples thereof include a method in which a hydroxylamine compound, a basic compound, at least one selected from the group consisting of a reducing agent other than the hydroxylamine compound and a chelating agent, and the other optional components are added to at least one of water or an organic solvent, stirred, and mixed to prepare a treatment liquid. Further, in a case where the respective components are added to at least one of water or the organic solvent, they may be added at once or may be added in portions over a plurality of times.

In addition, as the respective components included in the treatment liquid, components classified into a semiconductor grade or components classified into a high-purity grade equivalent thereto are preferably used, and components which have been subjected to removal of foreign matters by filtering and/or reduction in ion components with an ion exchange resin or the like are preferably used. Further, it is preferable that the raw material components are mixed, and then subjected to removal of foreign matters by filtering and/or reduction in ion components with an ion exchange resin or the like are used.

Furthermore, in a case where the treatment liquid is used in the form of a concentrate, a diluted liquid is obtained by diluting the treatment liquid 5 to 2,000 folds after carrying out the washing step B, and then the diluted liquid is used to carry out the washing step B. At this time, the dilution is preferably performed using a diluting liquid including water.

(Washing Step B)

Examples of a washing target to be washed in the washing step B include the above-mentioned laminate, and examples thereof include the laminate 10 having holes formed by carrying out a dry etching step as described above (see FIG. 1). Further, the dry etching residues 12 adhere to the inside of the holes 6 in the laminate 10.

In addition, the laminate which has been subjected to a dry ashing step after the dry etching step may be referred to as a washing target.

A method for bringing the treatment liquid into contact with the washing target is not particularly limited, but examples thereof include a method in which a washing target is immersed in a treatment liquid contained in a tank, a method in which a treatment liquid is sprayed onto a washing target, a method in which a treatment liquid is flowed onto a washing target, and any combinations thereof. From the viewpoint of the residue removing performance, the method in which a washing target is immersed in a treatment liquid is preferable.

A temperature of the treatment liquid is preferably set to 90° C. or lower, and is more preferably 25° C. to 80° C., still more preferably 30° C. to 75° C., and particularly preferably 40° C. to 65° C.

The washing time can be adjusted depending on the washing method used and the temperature of the treatment liquid.

In a case where washing is performed in an immersion batch mode (a batch mode in which a plurality of sheets of washing targets are immersed in a treatment tank to perform a treatment), the washing time is, for example, 60 minutes or less, preferably 1 to 60 minutes, more preferably 3 to 20 minutes, and still more preferably 4 to 15 minutes.

In a case where sheet-type washing is performed, the washing time is, for example, 10 seconds to 5 minutes, preferably 15 seconds to 4 minutes, more preferably 15 seconds to 3 minutes, and still more preferably 20 seconds to 2 minutes.

Furthermore, in order to further enhance the washing capability of the treatment liquid, a mechanical stirring method may be used.

Examples of the mechanical stirring method include a method in which a treatment liquid is circulated on a washing target, a method in which a treatment liquid is flowed through or sprayed on a washing target, and a method in which a treatment liquid is stirred with an ultrasonic or a megasonic.

(Rinsing Step B2)

The method for washing a substrate of the embodiment of the present invention may further have a step (hereinafter referred as a "rinsing step B2") of cleaning the washing target by rinsing it with a solvent after the washing step B.

The rinsing step B2 is preferably a step which is performed subsequently after the washing step B, and involves rinsing performed with a rinsing solvent (rinsing liquid) over 5 seconds to 5 minutes. The rinsing step B2 may be performed using the above-mentioned mechanical stirring method.

Examples of the rinsing solvent include, but are not limited to, deionized (DI) water, methanol, ethanol, isopropyl alcohol, N-methylpyrrolidinone, γ-butyrolactone, dimethyl sulfoxide, ethyl lactate, and propylene glycol monomethyl ether acetate. Alternatively, an aqueous rinsing liquid (diluted aqueous ammonium hydroxide or the like) with a pH>8 may be used.

As the rinsing solvent, an aqueous ammonium hydroxide solution, DI water, methanol, ethanol, or isopropyl alcohol is preferable, an aqueous ammonium hydroxide solution, DI water, or isopropyl alcohol is more preferable, and an aqueous ammonium hydroxide solution or DI water are still more preferable.

As a method for bringing the rinsing solvent into contact with the washing target, the above-mentioned method in which the treatment liquid is brought into contact with a washing target can be applied in the same manner.

The temperature of the rinsing solvent in the rinsing step B2 is preferably 16° C. to 27° C.

(Drying Step B3)

The method for washing a substrate of the embodiment of the present invention may have a drying step B3 in which the washing target is dried after the rinsing step B2.

The drying method is not particularly limited. Examples of the drying method include a spin drying method, a method of flowing a dry gas onto a washing target, a method of heating a substrate by a heating means such as a hot plate and an infrared lamp, a Marangoni drying method, a Rotagoni drying method, an isopropyl alcohol (IPA) drying method, or any combinations thereof.

The drying time depends on a specific method used, but is generally preferably 30 seconds to several minutes.

The washing target of the method for washing a substrate of the embodiment of the present invention is not limited to a laminate comprising at least a metal layer including Co or a Co alloy, an interlayer insulating layer, and a metal hard mask in this order on a substrate, as described above. That is, for example, the method can also be used to remove photoresist etching residues of a laminate comprising at least a metal layer including Co or a Co alloy, an interlayer insulating layer, and a photoresist film in this order on a substrate.

EXAMPLES

Hereinbelow, the present invention will be described in more detail with reference to Examples. The materials, the use amounts, the proportions, the treatment details, the treatment procedure, and the like shown in Examples below may be modified as appropriate as long as the modifications do not depart from the spirit of the present invention. Therefore, the scope of the present invention should not be construed as being limited to Examples shown below. Further, "%" is intended to be "% by mass" unless otherwise specified.

[Evaluation of Etching Residues (PER)]

(1) Preparation of Treatment Liquid

Each of treatment liquids shown in Table 1 (Examples 1 to 44 and Comparative Examples 1 to 3) was prepared. Further, in each of the treatment liquids, the contents of various components used (all based on mass) are as described below.

Here, various components shown in Table 1 which are all classified into a semiconductor grade or a high-purity grade equivalent thereto were used.

Various components used in the treatment liquid are shown below.

<Hydroxylamine Compound>
HA: Hydroxylamine (manufactured by BASF)
HAS: Hydroxylamine sulfate (manufactured by BASF)
HAC: Hydroxylamine hydrochloride (manufactured by BASF)
DEHA: N,N-Diethylhydroxylamine (manufactured by Wako Pure Chemical Industries, Ltd.)

<Amine Compound Other than Hydroxylamine Compound>
Amine compound 1: Tetrahydrofurfurylamine (manufactured by Tokyo Kasei Kogyo Co., Ltd.)
Amine compound 2: N-(2-Aminoethyl)piperazine (manufactured by Tokyo Kasei Kogyo Co., Ltd.)
Amine compound 3: 1,8-Diazabicyclo[5.4.0]-7-undecene (manufactured by Wako Pure Chemical Industries, Ltd.)
Amine compound 4: 1,4-Diazabicyclo[2.2.2]octane (manufactured by Tokyo Kasei Kogyo Co., Ltd.)

<Quaternary Ammonium Hydroxide Salt>
TMAH: Tetramethylammonium hydroxide (manufactured by Sachem Inc.)
TBAH: Tetrabutylammonium hydroxide (manufactured by Sachem Inc.)
BeTMAH: Benzyltrimethylammonium hydroxide (manufactured by Aldrich)

<Organic Solvent>
Organic Solvent 1: 3-Methoxy-3-methyl-1-butanol (manufactured by Tokyo Kasei Kogyo Co., Ltd.)
Organic solvent 2: Ethylene glycol monobutyl ether (manufactured by Wako Pure Chemical Industries, Ltd.)
Organic solvent 3: Dimethyl sulfoxide (manufactured by Wako Pure Chemical Industries, Ltd.)

<Corrosion Inhibitor>
5-MBTA: 5-methyl-1H-benzotriazole (manufactured by Tokyo Kasei Kogyo Co., Ltd.), corresponding to Formula (A)
BTA: Benzotriazole (manufactured by Tokyo Kasei Kogyo Co., Ltd.), corresponding to Formula (A)
Irgamet 42: manufactured by BASF, corresponding to Formula (A)
Irgamet 39: manufactured by BASF, corresponding to Formula (A)

<Reducing Agent Other than Hydroxylamine Compound or Chelating Agent>
(Reducing Agent Other than Hydroxylamine Compound)
Gallic acid (manufactured by Wako Pure Chemical Industries, Ltd.), corresponding to Formula (B)
Catechol (manufactured by Wako Pure Chemical Industries, Ltd.), corresponding to Formula (B)
Thioglycolic acid (manufactured by Tokyo Kasei Kogyo Co., Ltd.)
Mercapto succinic acid (manufactured by Tokyo Kasei Kogyo Co., Ltd.)
Thioglycerol (manufactured by Tokyo Kasei Kogyo Co., Ltd.)
Ascorbic acid (manufactured by Tokyo Kasei Kogyo Co., Ltd.)

(Chelating Agent)
Citric acid (manufactured by Wako Pure Chemical Industries, Ltd.)
DTPA: Diethylenetriamine tetraacetic acid (manufactured by Tokyo Kasei Kogyo Co., Ltd.)
NTMP: Nitrilotris(methylenephosphonic acid) (manufactured by Wako Pure Chemical Industries, Ltd.)
Methanesulfonic acid (manufactured by Wako Pure Chemical Industries, Ltd.)

\<Water\>

Ultrapure water (2) Evaluation

Each of the treatment liquids prepared above was subjected to various evaluations shown below.

(2)-1. Anticorrosion Performance (Co Anticorrosion Capability)

Each of the treatment liquids of Examples and Comparative Examples was prepared, and then the Co film (a model film of a metal which serves as an electrode material such as a wiring) was subjected to an etching treatment.

Specifically, the Co film was immersed in the treatment liquids of Examples and Comparative Examples for 10 minutes, and a variation in a sheet resistance value ($\Omega/\square$) between before and after the immersion in the treatment liquid ((the sheet resistance value of the Co film after immersion—the sheet resistance value of the Co film before immersion)) was converted to a film thickness difference, and the etching rate (Å/min) was calculated to evaluate the Co anticorrosion capability.

Furthermore, the sheet resistance value (($\Omega/\square$) was calculated, based on a voltage value upon application of a current of 30 mA to each film, using a sheet resistance meter (Model #: Body VR-120S, Four-probe Probe KS-TC-200-MT-200g, manufactured by Hitachi Kokusai Electric Inc.)

In a case where the variation in the sheet resistance value is small, the Co anticorrosion capability is excellent, whereas in a case where the variation in the sheet resistance value is large, the Co anticorrosion capability is deteriorated.

Evaluation of the Co anticorrosion capability was carried out using each of not only the treatment liquid ("0 h" in the table) immediately after the preparation but also the treatment liquid ("12 h" in the table) after storage for 12 hours under an air-tight condition at 60° C. and the treatment liquid ("24 h" in the table) after storage for 24 hours under the same condition were respectively carried out, and the change in the Co anticorrosion capability of the treatment liquid over time was also evaluated.

The results are shown in Table 1.

(2)-2. Evaluation of Residue Removing Performance

Using each of the treatment liquids of Examples and Comparative Examples, evaluation of the residue removing performance was performed. Further, in the following evaluation, a model film formed of $TiO_2$ which is one of residues produced in the plasma etching of a metal hard mask (MHM) was prepared, and its etching rate was evaluated to evaluate the residue removing performance. That is, it can be said that in a case where the etching rate is high, the residue removing performance is excellent, whereas in a case where the etching rate is low, the residue removing performance is deteriorated.

In addition, a model film formed of $TiO_2$ ($TiO_2$ film) is provided with a film thickness of 1,000 Å on a Si substrate.

After each of the treatment liquids of Examples and Comparative Examples was prepared, the $TiO_2$ film was subjected to an etching treatment. Specifically, the $TiO_2$ film was immersed in the treatment liquids of Examples and Comparative Examples for 5 minutes, and the etching rate (Å/min) was calculated, based on a difference in the film thickness between before and after the immersion in the treatment liquid.

Furthermore, the film thickness of the $TiO_2$ film before and after the treatment was measured using ellipsometry (spectroscopic ellipsometer, trade name "Vase", manufactured by J. A. Woollam Co.) under the conditions of a measuring range of 250 to 1,000 nm and measuring angles of 70 degrees and 75 degrees.

The calculated etching rate (ER) of the $TiO_2$ film was evaluated according to the following evaluation standard. Further, in the following evaluation standard, A to C indicate that the etching rate (ER) is preferable in practical use.

"A": 1.5 (Å/min)<ER

"B": 1.0 (Å/min)<ER≤1.5 (Å/min)

"C": 0.5 (Å/min)<ER≤1.0 (Å/min)

"D": 0.3 (Å/min)<ER≤0.5 (Å/min)

"E": 0.3 (Å/min) or less

Evaluation of the residue removing performance was carried out using each of not only the treatment liquid ("0 h" in the table) immediately after the preparation but also the treatment liquid ("12 h" in the table) after storage for 12 hours under an air-tight condition at 60° C. and the treatment liquid ("24 h" in the table) after storage for 24 hours under the same condition were respectively carried out, and the change in the residue removing performance of the treatment liquid over time was evaluated.

The results are shown in Table 1.

(2)-3. Evaluation of Temporal Stability in Thermal Environment

A variation in the variation of the hydroxylamine compound in the treatment liquid was calculated using the treatment liquid after storage at 60° C. for 24 hours to evaluate the temporal stability in a thermal environment of the treatment liquid (that is, for example, in Example 1, by quantifying the residual amounts of the HA as the hydroxylamine compound, the variation was determined to evaluate the temporal stability in a thermal environment of the treatment liquid). It can be said that as the variation of the hydroxylamine compound in the treatment liquid is smaller, the temporal stability in a thermal environment is excellent.

The residual amount of the hydroxylamine compound in the treatment liquid was quantified by adding 2-fold equivalents of 2-butanone relative to the molar concentration of the hydroxylamine compound during the preparation to a sample, and confirming the reactant with nuclear magnetic resonance (NMR).

The temporal stability in a thermal environment was evaluated according to the following evaluation standard. Further, in the following evaluation standard, A to C indicate that the temporal stability in a thermal environment is preferable in practical use.

"A": The variation in the hydroxylamine compound was 3% or less.

"B": The variation in the hydroxylamine compound was more than 3% and 5% or less.

"C": The variation in the hydroxylamine compound was more than 5% and 10% or less.

"D": The variation in the hydroxylamine compound was more than 10% and 20% or less.

"E": The variation in the hydroxylamine compound was more than 20%.

The results are shown in Table 1.

Furthermore, the variation is a numerical value (%) shown by [{(the initial amount of the hydroxylamine compound)−(the amount of the hydroxylamine compound after storage of the treatment liquid)}/(the initial amount of the hydroxylamine compound)]×100. The (amount of the hydroxylamine compound after storage of the treatment liquid) corresponds to the residual amount of the hydroxylamine compound in the treatment liquid.

TABLE 1

| Table 1 | Treatment liquid Composition (% by mass) | | | | | | | |
|---|---|---|---|---|---|---|---|---|
| | Hydroxylamine compound (% by mass) | Amine compound other than the hydroxylamine compound (% by mass) | Quaternary ammonium hydroxide salt (% by mass) | Organic solvent (% by mass) | Reducing agent and/or chelating agent (% by mass) | Corrosion inhibitor (% by mass) | Water (% by mass) | pH |
| Example 1 | HA 10.0% | Amine compound 1 10% | — | — | Gallic acid 5.0% | — | Balance | 13 |
| Example 2 | HA 10.0% | Amine compound 1 10% | — | Organic solvent 1 40.0% | Gallic acid 5.0% | — | Balance | 13 |
| Example 3 | HA 10.0% | Amine compound 1 10% | — | — | Gallic acid 5.0% | 5-MBTA 1.0% | Balance | 13 |
| Example 4 | HA 10.0% | Amine compound 1 10% | — | Organic solvent 1 40.0% | Gallic acid 5.0% | 5-MBTA 1.0% | Balance | 13 |
| Example 5 | HA 3.0% | Amine compound 1 10% | — | Organic solvent 1 40.0% | Gallic acid 5.0% | 5-MBTA 1.0% | Balance | 13 |
| Example 6 | HA 6.0% | Amine compound 1 10% | — | Organic solvent 1 40.0% | Gallic acid 5.0% | 5-MBTA 1.0% | Balance | 13 |
| Example 7 | HA 20.0% | Amine compound 1 10% | — | Organic solvent 1 40.0% | Gallic acid 5.0% | 5-MBTA 1.0% | Balance | 13 |
| Example 8 | HAS 10.0% | Amine compound 1 20% | — | Organic solvent 1 40.0% | Gallic acid 5.0% | 5-MBTA 1.0% | Balance | 13 |
| Example 9 | HAC 10.0% | Amine compound 1 20% | — | Organic solvent 1 40.0% | Gallic acid 5.0% | 5-MBTA 1.0% | Balance | 13 |
| Example 10 | DEHA 10.0% | Amine compound 1 20% | — | Organic solvent 1 40.0% | Gallic acid 5.0% | 5-MBTA 1.0% | Balance | 13 |
| Example 11 | HA 10.0% | Amine compound 1 10% | — | Organic solvent 1 20.0% | Gallic acid 5.0% | 5-MBTA 1.0% | Balance | 13 |
| Example 12 | HA 10.0% | Amine compound 1 10% | — | Organic solvent I 50.0% | Gallic acid 5.0% | 5-MBTA 1.0% | Balance | 13 |
| Example 13 | HA 10.0% | Amine compound 1 10% | — | Organic solvent 1 70.0% | Gallic acid 5.0% | 5-MBTA 1.0% | Balance | 13 |
| Example 14 | HA 10.0% | Amine compound 1 10% | TMAH 0.5% | Organic solvent 1 40.0% | Gallic acid 5.0% | 5-MBTA 1.0% | Balance | 14 |
| Example 15 | HA 10.0% | Amine compound 1 10% | TMAH 1.5% | Organic solvent I 40.0% | Gallic acid 5.0% | 5-MBTA 1.0% | Balance | 14 |
| Example 16 | HA 10.0% | Amine compound 1 10% | TBAH 0.5% | Organic solvent 1 40.0% | Gallic acid 5.0% | 5-MBTA 1.0% | Balance | 14 |
| Example 17 | HA 10.0% | Amine compound 1 10% | BeTMAH 0.5% | Organic solvent 1 40.0% | Gallic acid 5.0% | 5-MBTA 1.0% | Balance | 14 |
| Example 18 | HA 10.0% | Amine compound 2 5% | — | Organic solvent 1 40.0% | Gallic acid 5.0% | 5-MBTA 1.0% | Balance | 13 |
| Example 19 | HA 10.0% | Amine compound 3 5% | — | Organic solvent 1 40.0% | Gallic acid 5.0% | 5-MBTA 1.0% | Balance | 13 |
| Example 20 | HA 10.0% | Amine compound 4 20% | — | Organic solvent 1 40.0% | Gallic acid 5.0% | 5-MBTA 1.0% | Balance | 13 |
| Example 21 | HA 10.0% | Amine compound 1 5% | — | Organic solvent I 40.0% | Gallic acid 5.0% | 5-MBTA 1.0% | Balance | 11.5 |
| Example 22 | HA 10.0% | Amine compound 1 3% | — | Organic solvent 1 40.0% | Gallic acid 5.0% | 5-MBTA 1.0% | Balance | 10 |
| Example 23 | HA 10.0% | Amine compound 1 2% | — | Organic solvent 1 40.0% | Gallic acid 0.5% | 5-MBTA 1.0% | Balance | 13 |
| Example 24 | HA 10.0% | Amine compound 1 2% | — | Organic solvent 1 40.0% | Gallic acid 1.0% | 5-MBTA 1.0% | Balance | 13 |
| Example 25 | HA 10.0% | Amine compound 1 6% | — | Organic solvent 1 40.0% | Gallic acid 3.0% | 5-MBTA 1.0% | Balance | 13 |

| Table 1 | Evaluation results | | | | | | | |
|---|---|---|---|---|---|---|---|---|
| | Hydroxylamine compound/ reducing agent (mass ratio) | Basic compound/ reducing agent (mass ratio) | 0 h Co ER (Å/min) | 0 h Residue removing performance | 12 h Co ER (Å/min) | 12 h Residue removing performance | 24 h Co ER (Å/min) | 24 h Residue removing performance | Temporal stability in a thermal environment |
| Example 1 | 2 | 2 | 1.8 | C | 1.7 | C | 1.9 | C | A |
| Example 2 | 2 | 2 | 1.8 | B | 1.8 | B | 2.0 | B | A |
| Example 3 | 2 | 2 | <0.5 | C | <0.5 | C | <0.5 | C | A |
| Example 4 | 2 | 2 | <0.5 | B | <0.5 | B | <0.5 | B | A |
| Example 5 | 0.6 | 2 | <0.5 | C | <0.5 | C | <0.5 | C | A |
| Example 6 | 1.2 | 2 | <0.5 | B | <0.5 | B | <0.5 | B | A |
| Example 7 | 4 | 2 | <0.5 | A | <0.5 | A | <0.5 | A | A |
| Example 8 | 2 | 4 | <0.5 | B | <0.5 | B | <0.5 | B | A |
| Example 9 | 2 | 4 | 1.2 | B | 1.3 | B | 1.2 | B | A |
| Example 10 | 2 | 4 | <0.5 | C | <0.5 | C | <0.5 | C | A |

TABLE 1-continued

| | | | | | | | | | |
|---|---|---|---|---|---|---|---|---|---|
| Example 11 | 2 | 2 | <0.5 | B | <0.5 | B | <0.5 | B | A |
| Example 12 | 2 | 2 | <0.5 | A | <0.5 | A | <0.5 | A | A |
| Example 13 | 2 | 2 | <0.5 | A | <0.5 | A | <0.5 | A | A |
| Example 14 | 2 | 2 | <0.5 | A | <0.5 | A | <0.5 | B | B |
| Example 15 | 2 | 2 | <0.5 | A | <0.5 | A | <0.5 | B | B |
| Example 16 | 2 | 2 | <0.5 | A | <0.5 | A | <0.5 | B | B |
| Example 17 | 2 | 2 | <0.5 | A | <0.5 | A | <0.5 | B | B |
| Example 18 | 2 | 1 | <0.5 | B | <0.5 | B | <0.5 | B | A |
| Example 19 | 2 | 1 | <0.5 | B | <0.5 | B | <0.5 | B | A |
| Example 20 | 2 | 4 | <0.5 | B | <0.5 | B | <0.5 | B | A |
| Example 21 | 2 | 1 | <0.5 | B | <0.5 | B | <0.5 | B | A |
| Example 22 | 2 | 0.6 | <0.5 | B | <0.5 | B | <0.5 | B | A |
| Example 23 | 20 | 4 | <0.5 | B | <0.5 | B | 0.6 | C | B |
| Example 24 | 10 | 2 | <0.5 | B | <0.5 | B | 0.6 | C | B |
| Example 25 | 3.3 | 2 | <0.5 | B | <0.5 | B | <0.5 | B | A |

TABLE 2

| | Treatment liquid Composition (% by mass) | | | | | | |
|---|---|---|---|---|---|---|---|
| Table 1 (continued) | Hydroxylamine compound (% by mass) | Amine compound other than other than hydroxylamine compound (% by mass) | Quaternary ammonium hydroxide salt (% by mass) | Organic solvent (% by mass) | Reducing agent and/or chelating agent (% by mass) | Corrosion inhibitor (% by mass) | Water (% by mass) |
| Example 26 | HA 10.0% | Amine compound 1 5% | — | Organic solvent 1 40.0% | Catechol 5.0% | 5-MBTA 1.0% | Balance |
| Example 27 | HA 10.0% | Amine compound 1 10% | — | Organic solvent 1 40.0% | Thioglycolic acid 5.0% | 5-MBTA 1.0% | Balance |
| Example 28 | HA 10.0% | Amine compound 1 10% | — | Organic solvent 1 40.0% | Mercapto succinic acid 5.0% | 5-MBTA 1.0% | Balance |
| Example 29 | HA 10.0% | Amine compound 1 10% | — | Organic solvent 1 40.0% | DTPA 5.0% | 5-MBTA 1.0% | Balance |
| Example 30 | HA 10.0% | Amine compound 1 10% | — | Organic solvent 1 40.0% | NTMP 5.0% | 5-MBTA 1.0% | Balance |
| Example 31 | HA 10.0% | Amine compound 1 10% | — | Organic solvent 1 40.0% | Methanesulfonic acid 5.0% | 5-MBTA 1.0% | Balance |
| Example 32 | HA 10.0% | Amine compound 1 10% | — | Organic solvent 1 40.0% | Ascorbic acid 5.0% | 5-MBTA 1.0% | Balance |
| Example 33 | HA 10.0% | Amine compound 1 10% | — | Organic solvent 1 40.0% | Gallic acid 2.5% DTPA 2.5% | 5-MBTA 1.0% | Balance |
| Example 34 | HA 10.0% | Amine compound 1 10% | — | Organic solvent 1 40.0% | Citric acid 5.0% | 5-MBTA 1.0% | Balance |
| Example 35 | HA 10.0% | Amine compound 1 10% | — | Organic solvent 1 40.0% | Gallic acid 5.0% | BTA 1.0% | Balance |
| Example 36 | HA 10.0% | Amine compound 1 10% | — | Organic solvent 1 40.0% | Gallic acid 5.0% | Irgamet 42 1.0% | Balance |
| Example 37 | HA 10.0% | Amine compound 1 10% | — | Organic solvent 1 40.0% | Gallic acid 5.0% | Irgamet 39 1.0% | Balance |
| Example 38 | HA 10.0% | Amine compound 1 10% | — | Organic solvent 1 40.0% | Thioglycerol 5.0% | 5-MBTA 1.0% | Balance |
| Example 39 | HA 10.0% | Amine compound 1 10% | — | Organic solvent 2 40.0% | Gallic acid 5.0% | 5-MBTA 1.0% | Balance |
| Example 40 | HA 10.0% | Amine compound 1 10% | — | Organic solvent 3 40.0% | Gallic acid 5.0% | 5-MBTA 1.0% | Balance |
| Example 41 | HA 10.0% | Amine compound 1 10% | — | Organic solvent 1 40.0% | Gallic acid 0.3% | 5-MBTA 1.0% | Balance |
| Example 42 | HA 1.0% | Amine compound 1 1% | — | Organic solvent 1 40.0% | Gallic acid 15.0% | 5-MBTA 1.0% | Balance |
| Example 43 | HA 1.0% | Amine compound 1 15% | — | Organic solvent 1 40.0% | Gallic acid 0.3% | 5-MBTA 1.0% | Balance |
| Example 44 | HA 1.0% | Amine compound 1 10% | — | Organic solvent 1 40.0% | Gallic acid 20.0% | 5-MBTA 1.0% | Balance |
| Comparative Example 1 | HA 10.0% | Amine compound 1 10% | — | — | — | — | Balance |
| Comparative Example 2 | HA 10.0% | Amine compound 1 1% | — | Organic solvent 1 40.0% | Gallic acid 5.0% | 5-MBTA 1.0% | Balance |
| Comparative Example 3 | HA 10.0% | Amine compound 1 0.5% | — | Organic solvent 1 40.0% | Gallic acid 5.0% | 5-MBTA 1.0% | Balance |

TABLE 2-continued

| Table 1 (continued) | pH | Hydroxylamine compound/ reducing agent (mass ratio) | Basic compound/ reducing agent (mass ratio) | 0 h Co ER (Å/min) | 0 h Residue removing performance | 12 h Co ER (Å/min) | 12 h Residue removing performance | 24 h Co ER (Å/min) | 24 h Residue removing performance | Temporal stability in a thermal environment |
|---|---|---|---|---|---|---|---|---|---|---|
| Example 26 | 13 | 2 | 1 | <0.5 | B | <0.5 | B | <0.5 | B | A |
| Example 27 | 13 | 2 | 2 | <0.5 | B | <0.5 | B | <0.5 | B | A |
| Example 28 | 13 | 2 | 2 | <0.5 | B | <0.5 | B | <0.5 | B | A |
| Example 29 | 13 | 2 | 2 | <0.5 | B | <0.5 | B | 0.8 | C | C |
| Example 30 | 13 | 2 | 2 | <0.5 | B | <0.5 | B | 0.9 | C | C |
| Example 31 | 13 | 2 | 2 | <0.5 | B | <0.5 | B | 0.9 | C | C |
| Example 32 | 13 | 2 | 2 | <0.5 | B | <0.5 | B | 0.9 | B | B |
| Example 33 | 13 | 2 | 2 | <0.5 | B | <0.5 | B | <0.5 | B | A |
| Example 34 | 13 | 2 | 2 | <0.5 | B | <0.5 | B | 0.8 | C | C |
| Example 35 | 13 | 2 | 2 | <0.5 | B | <0.5 | B | <0.5 | B | A |
| Example 36 | 13 | 2 | 2 | <0.5 | B | <0.5 | B | <0.5 | B | A |
| Example 37 | 13 | 2 | 2 | <0.5 | B | <0.5 | B | <0.5 | B | A |
| Example 38 | 13 | 2 | 2 | <0.5 | B | <0.5 | B | <0.5 | B | A |
| Example 39 | 13 | 2 | 2 | <0.5 | B | <0.5 | B | <0.5 | B | A |
| Example 40 | 13 | 2 | 2 | <0.5 | B | <0.5 | B | <0.5 | B | A |
| Example 41 | 13 | 33.3 | 33.3 | 0.4 | B | 0.3 | B | 0.2 | B | D |
| Example 42 | 10 | 0.066 | 0.066 | 0.5 | D | 0.2 | D | 0.4 | D | C |
| Example 43 | 14 | 3.33 | 50 | 0.4 | C | 0.3 | C | 0.2 | C | D |
| Example 44 | 13 | 0.5 | 0.05 | 0.5 | D | 0.2 | D | 0.4 | D | C |
| Comparative Example 1 | 14 | — | — | 25.6 | B | 15.6 | E | 13.4 | E | E |
| Comparative Example 2 | 8.5 | 2 | 2 | 1.2 | E | 1.3 | E | 1.4 | E | A |
| Comparative Example 3 | 7 | 2 | 2 | 3.5 | E | 3.6 | E | 3.4 | E | A |

From Table 1, it was found that with the treatment liquids of Examples, the temporal stability of residue removing performance is excellent and the anticorrosion performance for a treatment target is also excellent. Further, it was found that with the treatment liquids of Examples, the decomposition of the hydroxylamine compound hardly occurs even in case of storage in a thermal environment, and the temporal stability in a thermal environment is also excellent.

From the comparison of Example 1 and Example 2, it was confirmed that by incorporating a small amount of the organic solvent into the treatment liquid, the residue removing performance is further improved and the temporal stability is also excellent.

From the comparison of Example 1 and Example 3, it was confirmed that by incorporating a predetermined amount of the corrosion inhibitor into the treatment liquid, the anticorrosion properties for the metal layer can be further improved.

From the comparison of Example 1 and Example 4, it was confirmed that by incorporating the organic solvent and the corrosion inhibitor into the treatment liquid, the residue removing performance and the temporal stability are more excellent, and the anticorrosion properties for the metal layer are further improved.

From the comparison between Example 4 and Examples 18 to 20, it was confirmed that even with a change in the type of the amine compound other than the hydroxylamine compound, the obtained treatment liquid has excellent temporal stability of residue removing performance and excellent anticorrosion performance for a treatment target.

From the comparison of Example 4 and Examples 35 to 37, it was confirmed that even with a change in the type of the corrosion inhibitor, the obtained treatment liquid has excellent temporal stability of residue removing performance and excellent anticorrosion performance for a treatment target.

From the comparison between Example 4 and Examples 39 and 40, it was confirmed that even with a change in the type of the organic solvent, the obtained treatment liquid has excellent temporal stability of residue removing performance and excellent anticorrosion performance for a treatment target.

From the comparison of Examples 4 to 7, it was confirmed that in a case where the content of the hydroxylamine is 3.5% by mass or more, and more preferably 12% by mass or more, with respect to the total mass of the treatment liquid, the residue removing performance was excellent.

In addition, from the comparison of Examples 4, and 8 to 10, it was confirmed that in a case of using hydroxylamine (HA), hydroxylamine sulfate (HAS), or hydroxylamine hydrochloride (HAC) as a type of the hydroxylamine compound, the residue removing performance is more excellent, and in a case of using hydroxylamine (HA), hydroxylamine sulfate (HAS), or N,N-diethylhydroxylamine (DEHA), the anticorrosion property is more excellent.

From the comparison of Examples Example 4, and 11 to 13, it was confirmed that in a case where the treatment liquid contains the organic solvent in the amount of 45% by mass or more with respect to the total mass of the treatment liquid, the residue removing performance is more improved and the temporal stability is also excellent.

From the comparison of Examples 4, and 14 to 17, it was confirmed that in a case where the treatment liquid uses an amine compound other than the hydroxylamine and a quaternary ammonium hydroxide salt in combination as a basic compound, the residue removing performance is more improved.

From the comparison of Examples 4, 23, 24, and 25, it was confirmed that in a case where the content of at least one selected from the group consisting of a reducing agent other than the hydroxylamine compound and a chelating agent is 2.5% by mass or more with respect to the total mass of the treatment liquid, the temporal stability of residue removing performance is more excellent. In addition, it was confirmed that the treatment liquid has excellent temporal stability in a thermal environment.

From the comparison of Examples 4, and 26 to 34, it was confirmed that in a case of using a reducing agent (compound represented by Formula (B) (preferably catechol or gallic acid), a mercaptan compound (preferably thioglycolic acid, mercaptosuccinic acid, or thioglycerol), or ascorbic acid) other than the hydroxylamine compound, the temporal stability of residue removing performance is more excellent, as compared with a case of using a chelating agent. Further, it is confirmed that the treatment liquid also has excellent temporal stability in a thermal environment.

Furthermore, it was confirmed that in a case of using a compound represented by Formula (B) (preferably catechol or gallic acid), a mercaptan compound (preferably thioglycolic acid, mercaptosuccinic acid, or thioglycerol) among the reducing agents other than the hydroxylamine compound, the treatment liquid has excellent temporal stability in a thermal environment.

From the comparison of Examples 4, and 41 to 44, it was confirmed that in a case where the content of the hydroxylamine compound to the content of the reducing agent other than the hydroxylamine compound is 0.1 to 20 in terms of mass ratio, the temporal stability in a thermal environment is also more excellent, and further, the residue removing performance and the temporal stability are more excellent. In addition, in a case where the content of the basic compound to the content of the reducing agent other than the hydroxylamine compound is 0.1 to 20 in terms of mass ratio, the temporal stability in a thermal environment is also more excellent, and further, the residue removing performance and the temporal stability are more excellent.

[Evaluation of Resist Peeling]

A test of peeling the photoresist film used in the formation of a pattern from the substrate was performed, using the treatment liquids of Examples 4, 7, and 15 prepared above.

(1) Manufacture of Silicon Wafer Having Photoresist Film Disposed Thereon

According to the following procedure, a silicon wafer having a photoresist film disposed thereon was manufactured.

A positive tone resist composition was applied onto a Si wafer substrate with a spinner such that the thickness reached 1 μm. Then, the obtained resist film was subjected to prebaking for 2 minutes in an environment at 100° C., and then the resist film after the prebaking was exposed through a photomask. For the photomask, a linear pattern with a width of 5 μm was used. Further, development was performed using tetramethylammonium hydroxide (TMAH), thereby removing the photoresist film in the photosensitive portion.

(2) Evaluation (2)-1. Evaluation of Peelability of Photoresist Film

The peeling test of the photoresist film was carried out in the following procedure, using each of the treatment liquids of Examples 4, 7, and 15.

The silicon wafer having a photoresist film disposed thereon was cut into 1×2 cm to obtain a test wafer. A stirrer and the treatment liquid were put into a beaker and warmed to 60° C. while stirring the treatment liquid at a rotation speed of 250 rpm. Then, the test wafer was immersed for 5 minutes. Thereafter, the test wafer was taken out from the treatment liquid, and ion exchange water (DIW) was jetted onto on the test wafer from two-fluid nozzles to perform a rinsing treatment for 30 seconds.

The test wafer having a photoresist film which had been subjected to the treatment in <Peeling Test of Photoresist Film> was observed with an optical microscope (magnification of 50 times) to evaluate the peelability of the photoresist film under the following classification.

"A": A state where the residues are not observed with the optical microscope with a removal rate of 100%.

"B": A state where the residues can be observed with the optical microscope with a removal rate of more than 50% and less than 100%.

"C": A state where the residues can be observed with the optical microscope with a residual rate of more than 50%.

Evaluation on the peelability was carried out for each of the treatment liquid immediately after preparation ("0 h" in the table) and the treatment liquid after storage for 24 hours under an air-tight condition at 60° C. ("24 h" in the table), and the change of the peelability of the treatment liquid over time was also evaluated.

The results are shown in Table 2.

(2)-2. Anticorrosion Performance (Co Anticorrosion Capability)

The effects of the anticorrosion performance in Table 2 represent the results in Table 1.

TABLE 3

| Table 2 | Treatment liquid Composition (% by mass) | | | | |
|---|---|---|---|---|---|
| | Hydroxylamine compound (% by mass) | Amine compound other than the hydroxylamine compound (% by mass) | Quaternary ammonium hydroxide salt (% by mass) | Organic solvent (% by mass) | Reducing agent and/or chelating agent (% by mass) |
| Example 4 | HA 10.0% | Amount of amine compound 1 required | — | Organic solvent 1 40.0% | Gallic acid 5.0% |
| Example 7 | HA 20.0% | Amount of amine compound 1 required | — | Organic solvent 1 40.0% | Gallic acid 5.0% |
| Example 15 | HA 10.0% | Amount of amine compound 1 required | TMAH 1.5% | Organic solvent 1 40.0% | Gallic acid 5.0% |

TABLE 3-continued

| Table 2 | Treatment liquid Composition (% by mass) | | pH | Evaluation | | | |
|---|---|---|---|---|---|---|---|
| | Corrosion inhibitor (% by mass) | Water (% by mass) | | 0 h | | 24 h | |
| | | | | Co ER (Å/min) | Resist peelability | Co ER (Å/min) | Resist peelability |
| Example 4 | 5-MBTA 1.0% | Balance | 13 | <0.5 | A | <0.5 | A |
| Example 7 | 5-MBTA 1.0% | Balance | 13 | <0.5 | A | <0.5 | A |
| Example 15 | 5-MBTA 1.0% | Balance | 14 | <0.5 | A | <0.5 | A |

From the results, it was confirmed that the treatment liquid of the embodiment of the present invention is suitably used as a solution for removing various resist films used for the formation of a pattern in any of the state immediately after the preparation and during storage over time.

[Evaluation of Residue Removing Performance in Case of Use as Washing Liquid after Chemical Mechanical Polishing (pCMP)]

(1) Evaluation

A washing test was performed on the substrate after chemical mechanical polishing (CMP), using the treatment liquids of Examples 4, 7, and 15 prepared above.

Incidentally, in the following evaluation, a model substrate contaminated with metal impurities produced by polishing the wiring substrate was prepared, and the residue removing performance for the model substrate was evaluated. Specific methods thereof are each as follows.

(1)-1. Evaluation of Metal Impurity Removing Performance

First, the silicon wafer was washed with a mixed liquid formed of aqueous ammonia (29% by mass)-aqueous hydrogen peroxide (30% by mass)-water (volume ratio of 1:1:6). Then, the silicon wafer after washing was provided with cobalt (Co), calcium (Ca), nickel (Ni), iron (Fe), and zinc (Zn) such that the surface concentration reached $10^{10}$ atoms/$cm^2$ by a spin coating method, thereby contaminating the silicon wafer.

The contaminated silicon wafer obtained above was immersed at a treatment liquid (each of the treatment liquids of Examples 4, 7, and 15) at 25° C. and immersed for 3 minutes without stirring. After the immersion, the silicon wafer was taken out from the treatment liquid, subjected to a flowing water rinsing treatment for 3 minutes using ultrapure water, and dried.

The metal concentration on the wafer surface of the silicon wafer after drying was measured using a total reflection X-ray fluorescence spectrometer (TREX630 manufactured by Technos Co., Ltd.) to evaluate the metal impurity removing performance.

Evaluations of the washing property were each carried out on not only the treatment liquid immediately after preparation ("0 h" in the table) but also the treatment liquid after storage for 24 hours under an air-tight condition at 60° C. ("24 h" in the table), and the change of the metal impurity removing performance of the treatment liquid over time was also evaluated.

The results are shown in Table 3.

(1)-2. Evaluation of Fine Particle Removing Performance

A silicon wafer was polished for 30 seconds using a CMP device ("Reflexion (registered trademark)" manufactured by Applied Materials, Inc., Ltd.) and a CMP slurry ("BSL8210C" manufactured by FUJIFILM Corporation). Incidentally, a 12-inch silicon wafer having a Co film formed on the surface by a CVD method was used as the silicon wafer.

Subsequently, the silicon wafer after the polishing was washed with a washing device (ETS Co., Inc.). Specifically, the silicon wafer was subjected to brush scrubbing washing for 30 seconds using each of the treatment liquids maintained at room temperature (the treatment liquids of Examples 4, 7, and 15), then subjected to a rinsing treatment with ultrapure water for 30 seconds, and lastly spin-dried.

By measuring the number of fine particles on the surface of the silicon wafer after the washing using a surface inspection apparatus ("SP1" manufactured by KLA-Tencor Corporation), the fine particle removing performance was evaluated. Further, particles having an average particle diameter of 0.9 µm or more were measured as fine particles (unit: particles/12-inch wafer).

Evaluations of the washing property were each carried out on not only the treatment liquid immediately after preparation ("0 h" in the table) but also the treatment liquid after storage for 24 hours under an air-tight condition at 60° C. ("24 h" in the table), and the change of the fine particle removing performance of the treatment liquid over time was also evaluated.

The results are shown in Table 3.

(1)-3. Anticorrosion Performance (Co Anticorrosion Capability)

The effects of the anticorrosion performance in Table 3 represent the results in Table 1.

TABLE 4

| Table 3 | Treatment liquid Composition (% by mass) | | | | | |
|---|---|---|---|---|---|---|
| | Hydroxylamine compound (% by mass) | Amine compound other than hydroxylamine compound (% by mass) | Quaternary ammonium hydroxide salt (% by mass) | Organic solvent (% by mass) | Reducing agent and/or chelating agent (% by mass) | Corrosion inhibitor (% by mass) |
| Example 4 | HA 10.0% | Amount of amine compound 1 required | — | Organic solvent 1 40.0% | Gallic acid 5.0% | 5-MBTA 1.0% |
| Example 7 | HA 20.0% | Amount of amine compound 1 required | — | Organic solvent 1 40.0% | Gallic acid 5.0% | 5-MBTA 1.0% |
| Example 15 | HA 10.0% | Amount of amine compound 1 required | TMAH 1.5% | Organic solvent 1 40.0% | Gallic acid 5.0% | 5-MBTA 1.0% |
| | | | | | | Before washing (immediately after contamination) |

| | Treatment liquid Composition (% by mass) | | Evaluation 0 h | | | | | | |
|---|---|---|---|---|---|---|---|---|---|
| | | | Number of fine particles after washing | Metal surface concentration | | | | | |
| | Water | | | $10^{10}$ atoms/cm$^2$ | | | | | Co ER |
| Table 3 | (% by mass) | pH | (particles/12-inch wafer) | Co | Ca | Ni | Fe | Zn | (Å/min) |
| Example 4 | Balance | 13 | 1.3 | 2.5 | 1.4 | 0.7 | 0.5 | 0.2 | <0.5 |
| Example 7 | Balance | 13 | 3.1 | 1.1 | 1.7 | 0.5 | 0.1 | 0.1 | <0.5 |
| Example 15 | Balance | 14 | 2.2 | 3.0 | 2.0 | 0.3 | 0.1 | 0.1 | <0.5 |
| | Before washing (immediately after contamination) | | 1536.0 | | | | | | |

TABLE 5

| Table 3 (continued) | Treatment liquid Composition (% by mass) | | | | | |
|---|---|---|---|---|---|---|
| | Hydroxylamine compound (% by mass) | Amine compound other than hydroxylamine compound (% by mass) | Quaternary ammonium hydroxide salt (% by mass) | Organic solvent (% by mass) | Reducing agent and/or chelating agent (% by mass) | Corrosion inhibitor (% by mass) |
| Example 4 | HA 10.0% | Amount of amine compound 1 required | — | Organic solvent 1 40.0% | Gallic acid 5.0% | 5-MBTA 1.0% |
| Example 7 | HA 20.0% | Amount of amine compound 1 required | — | Organic solvent 1 40.0% | Gallic acid 5.0% | 5-MBTA 1.0% |
| Example 15 | HA 10.0% | Amount of amine compound 1 required | TMAH 1.5% | Organic solvent 1 40.0% | Gallic acid 5.0% | 5-MBTA 1.0% |
| | | | | | | Before washing (immediately after contamination) |

TABLE 5-continued

| Table 3 (continued) | Treatment liquid Composition (% by mass) Water (% by mass) | pH | Evaluation 24 h | | | | | | |
|---|---|---|---|---|---|---|---|---|---|
| | | | Number of fine particles after washing (particles/12-inch wafer) | Metal surface concentration | | | | | Co ER (Å/min) |
| | | | | $10^{10}$ atoms/cm$^2$ | | | | | |
| | | | | Co | Ca | Ni | Fe | Zn | |
| Example 4 | Balance | 13 | 1.5 | 3.1 | 1.3 | 0.4 | 0.2 | 0.3 | <0.5 |
| Example 7 | Balance | 13 | 2.7 | 1.4 | 1.6 | 0.5 | 0.1 | 0.2 | <0.5 |
| Example 15 | Balance | 14 | 2.5 | 2.7 | 2.3 | 0.2 | 0.2 | 0.2 | <0.5 |
| | Before washing (immediately after contamination) | | 1536.0 | | | | | | |

From the results, it was confirmed that the treatment liquid of the embodiment of the present invention is suitably used as a washing liquid for removing residues from a substrate after chemical mechanical polishing in any of the state immediately after the preparation and during storage over time.

EXPLANATION OF REFERENCES

1: substrate
2: metal layer
3: etching stop layer
4: interlayer insulating layer
5: metal hard mask
6: hole
10: laminate
11: inner wall
11a: cross-sectional wall
11b: bottom wall
12: dry etching residue

What is claimed is:
1. A treatment liquid for a semiconductor device, comprising:
at least one hydroxylamine compound selected from the group consisting of a hydroxylamine and a hydroxylamine salt;
at least one basic compound selected from the group consisting of an amine compound other than the hydroxylamine compound and a quaternary ammonium hydroxide salt;
a reducing agent other than the hydroxylamine compound or the reducing agent other than the hydroxylamine compound and a chelating agent and;
an organic solvent,
wherein the treatment liquid has a pH of 10 or more.
2. The treatment liquid according to claim 1,
which is used as a washing liquid for removing dry etching residues, a solution for removing a resist film used for the formation of a pattern, or a washing liquid for removing residues from a substrate after chemical mechanical polishing.
3. The treatment liquid according to claim 1,
which is used for a treatment to a metal layer of a substrate comprising the metal layer including Co or a Co alloy.
4. The treatment liquid according to claim 1,
wherein the content of the organic solvent is 45% by mass or more with respect to the total mass of the treatment liquid.
5. The treatment liquid according to claim 1, further comprising water,
wherein with respect to the total mass of the treatment liquid, the content of water is 1% to 50% by mass, and the content of the organic solvent is 45% to 98% by mass.
6. The treatment liquid according to claim 1,
wherein the content of the hydroxylamine compound is 3.5% by mass or more with respect to the total mass of the treatment liquid.
7. The treatment liquid according to claim 1,
wherein the chelating agent has at least one functional group selected from a carboxylic acid group, a sulfonic acid group, or a phosphonic acid group.
8. The treatment liquid according to claim 1,
wherein the basic compound is a cyclic compound.
9. The treatment liquid according to claim 8,
wherein the basic compound is at least one selected from the group consisting of tetrahydrofurfurylamine, N-(2-aminoethyl)piperazine, 1,8-diazabicyclo[5.4.0]-7-undecene, and 1,4-diazabicyclo[2.2.2]octane.
10. The treatment liquid according to claim 1,
wherein the reducing agent is one selected from the group consisting of a compound represented by Formula (B), ascorbic acids, and a compound containing a sulfur atom,

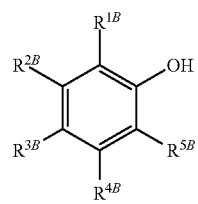

Formula (B)

in Formula (B), $R^{1B}$ to $R^{5B}$ each independently represent a hydrogen atom, a hydroxyl group, or a substituted or unsubstituted hydrocarbon group which may have a heteroatom.
11. The treatment liquid according to claim 1, further comprising a corrosion inhibitor.
12. The treatment liquid according to claim 11,
which contains a compound represented by Formula (A) as the corrosion inhibitor,

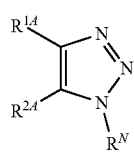

Formula (A)

in Formula (A), $R^{1A}$, $R^{2A}$, and $R^N$ each independently represent a hydrogen atom, or a substituted or unsubstituted hydrocarbon group, and further, $R^{1A}$ and $R^{2A}$ may be bonded to each other to form a ring.

13. The treatment liquid according to claim 1, wherein the content of the hydroxylamine compound with respect to the content of the reducing agent is 0.1 to 20 in terms of mass ratio.

14. The treatment liquid according to claim 1, wherein the content of the basic compound with respect to the content of the reducing agent is 0.1 to 20 in terms of mass ratio.

15. The treatment liquid according to claim 1, which is used after being diluted 5 to 2,000 folds.

16. The treatment liquid according to claim 15, which is diluted with a diluting liquid including water.

17. A method for washing a substrate, comprising a washing step of washing a substrate comprising a metal layer including Co or a Co alloy using the treatment liquid according to claim 1.

18. The method for washing a substrate according to claim 17, wherein the washing step is carried out using a diluted liquid after obtaining the diluted liquid by diluting the treatment liquid 5 to 2,000 folds.

19. The method for washing a substrate according to claim 18, wherein the dilution is performed using a diluting liquid including water.

20. A method for manufacturing a semiconductor device, comprising a step of washing a substrate including a metal hard mask including at least one of Cu, Co, W, $AlO_x$, AlN, $AlO_xN_y$, $WO_x$, Ti, TiN, $ZrO_x$, $HfO_x$, or $TaO_x$ with the treatment liquid according to claim 1, in which x and y are numbers represented by x=1 to 3 and y=1 to 2, respectively.

21. The treatment liquid according to claim 1, wherein the reducing agent is one selected from the group consisting of a compound represented by Formula (B), ascorbic acids, and a mercapto compound,

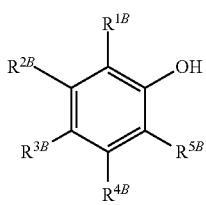

Formula (B)

in Formula (B), $R^{1B}$ to $R^{5B}$ each independently represent a hydrogen atom, a hydroxyl group, or a substituted or unsubstituted alkyl group having 1 to 12 carbon atoms, a substituted or unsubstituted alkenyl group having 2 to 12 carbon atoms, a substituted or unsubstituted alkynyl group having 2 to 12 carbon atoms, a substituted or unsubstituted aryl group having 6 to 22 carbon atoms or a substituted or unsubstituted aralkyl group having 7 to 23 carbon atoms, in which —$CH_2$— may be substituted with any one divalent group or a combination of a plurality of divalent groups selected from the group consisting of —O—, —S—, —CO—, —$SO_2$—, and -$NR^a$—, $R^a$ represents a hydrogen atom or a hydrocarbon group having 1 to 20 carbon atoms.

22. The treatment liquid according to claim 1, wherein the reducing agent is one selected from the group consisting of a compound represented by Formula (B), ascorbic acids, mercaptosuccinic acid, 1-thioglycerol, sodium 3-mercapto-1-propanesulfonate, 2-mercaptoethanol, thioglycolic acid, and 3-mercapto-1-propanol,

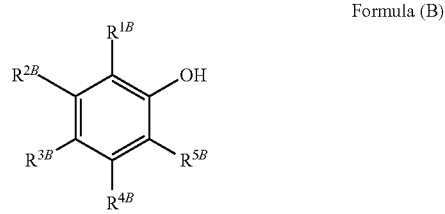

Formula (B)

in Formula (B), $R^{1B}$ to $R^{5B}$ each independently represent a hydrogen atom, a hydroxyl group, or a substituted or unsubstituted alkyl group having 1 to 12 carbon atoms, a substituted or unsubstituted alkenyl group having 2 to 12 carbon atoms, a substituted or unsubstituted alkynyl group having 2 to 12 carbon atoms, a substituted or unsubstituted aryl group having 6 to 22 carbon atoms or a substituted or unsubstituted aralkyl group having 7 to 23 carbon atoms, in which -$CH_2$- may be substituted with any one divalent group or a combination of a plurality of divalent groups selected from the group consisting of —O—, —S—, —CO—, —$SO_2$—, and —$NR^a$—, $R^a$ represents a hydrogen atom or a hydrocarbon group having 1 to 20 carbon atoms.

23. A treatment liquid for a semiconductor device, comprising:
at least one hydroxylamine compound selected from the group consisting of a hydroxylamine and a hydroxylamine salt;
at least one basic compound selected from the group consisting of an amine compound other than the hydroxylamine compound and a quaternary ammonium hydroxide salt; and
a reducing agent other than the hydroxylamine compound or the reducing agent other than the hydroxylamine compound and a chelating agent;
wherein the treatment liquid has a pH of 10 or more,
the hydroxylamine compound includes an unsubstituted hydroxylamine or an unsubstituted hydroxylamine salt, and
the content of the hydroxylamine compound is 3.5% by mass or more with respect to the total mass of the treatment liquid.

24. The treatment liquid according to claim 23, wherein the reducing agent is one selected from the group consisting of a compound represented by Formula (B), ascorbic acids, and a compound containing a sulfur atom,

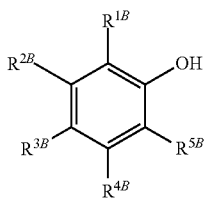

Formula (B)

in Formula (B), $R^{1B}$ to $R^{5B}$ each independently represent a hydrogen atom, a hydroxyl group, or a substituted or unsubstituted hydrocarbon group which may have a heteroatom.

25. The treatment liquid according to claim 23, wherein the reducing agent is one selected from the group consisting of a compound represented by Formula (B), ascorbic acids, and a mercapto compound,

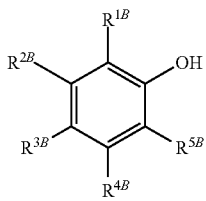

Formula (B)

in Formula (B), $R^{1B}$ to $R^{5B}$ each independently represent a hydrogen atom, a hydroxyl group, or a substituted or unsubstituted alkyl group having 1 to 12 carbon atoms, a substituted or unsubstituted alkenyl group having 2 to 12 carbon atoms, a substituted or unsubstituted alkynyl group having 2 to 12 carbon atoms, a substituted or unsubstituted aryl group having 6 to 22 carbon atoms or a substituted or unsubstituted aralkyl group having 7 to 23 carbon atoms, in which -CH$_2$- may be substituted with any one divalent group or a combination of a plurality of divalent groups selected from the group consisting of —O—, —S—, —CO—, —SO$_2$—, and —NR$^a$—, R$^a$ represents a hydrogen atom or a hydrocarbon group having 1 to 20 carbon atoms.

26. The treatment liquid according to claim 23, wherein the reducing agent is one selected from the group consisting of a compound represented by Formula (B), ascorbic acids, mercaptosuccinic acid, 1-thioglycerol, sodium 3-mercapto-1-propanesulfonate, 2-mercaptoethanol, thioglycolic acid, and 3-mercapto-1-propanol,

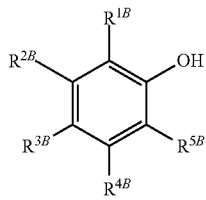

Formula (B)

in Formula (B), $R^{1B}$ to $R^{5B}$ each independently represent a hydrogen atom, a hydroxyl group, or a substituted or unsubstituted alkyl group having 1 to 12 carbon atoms, a substituted or unsubstituted alkenyl group having 2 to 12 carbon atoms, a substituted or unsubstituted alkynyl group having 2 to 12 carbon atoms, a substituted or unsubstituted aryl group having 6 to 22 carbon atoms or a substituted or unsubstituted aralkyl group having 7 to 23 carbon atoms, in which -CH$_2$- may be substituted with any one divalent group or a combination of a plurality of divalent groups selected from the group consisting of —O—, —S—, —CO—, —SO$_2$—, and —NR$^a$—, R$^a$ represents a hydrogen atom or a hydrocarbon group having 1 to 20 carbon atoms.

27. A treatment liquid for a semiconductor device, comprising:
    at least one hydroxylamine compound selected from the group consisting of a hydroxylamine and a hydroxylamine salt;
    at least one basic compound selected from the group consisting of an amine compound other than the hydroxylamine compound and a quaternary ammonium hydroxide salt; and
    at least one selected from the group consisting of a reducing agent other than the hydroxylamine compound and a chelating agent;
    an organic solvent, and
    having a pH of 10 or more,
    wherein the content of the organic solvent is 45% by mass or more with respect to the total mass of the treatment liquid.

* * * * *